(12) United States Patent
West et al.

(10) Patent No.: US 10,847,605 B2
(45) Date of Patent: *Nov. 24, 2020

(54) METHODS AND APPARATUS FOR HIGH VOLTAGE INTEGRATED CIRCUIT CAPACITORS

(71) Applicant: Texas Instruments Incorporated, Dallas, TX (US)

(72) Inventors: Jeffrey Alan West, Dallas, TX (US); Thomas D. Bonifield, Dallas, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 16 days.

This patent is subject to a terminal disclaimer.

(21) Appl. No.: 15/646,465

(22) Filed: Jul. 11, 2017

(65) Prior Publication Data
US 2017/0309702 A1    Oct. 26, 2017

Related U.S. Application Data

(60) Continuation of application No. 15/348,698, filed on Nov. 10, 2016, now Pat. No. 9,741,787, which is a
(Continued)

(51) Int. Cl.
*H01L 23/64* (2006.01)
*H01L 49/02* (2006.01)
(Continued)

(52) U.S. Cl.
CPC ............ *H01L 28/60* (2013.01); *H01L 23/552* (2013.01); *H01L 28/40* (2013.01);
(Continued)

(58) Field of Classification Search
None
See application file for complete search history.

(56) References Cited

U.S. PATENT DOCUMENTS

| 4,439,270 A | 3/1984 | Powell et al. |
| 4,780,795 A | 10/1988 | Meinel |

(Continued)

FOREIGN PATENT DOCUMENTS

| CN | 1841733 A | 10/2006 |
| CN | 102903629 A | 1/2013 |

(Continued)

OTHER PUBLICATIONS

Morimoto, N.J., "High Quality TEOS Silicon Oxide Depostied at Low Temperature for TFT Gate Dielectric Application," Jan. 2003, World Wide Web URL: http://www.electrochem.org/dl/ma/202/pdfs/0654.pdf; retrieved Nov. 5, 2015.

(Continued)

*Primary Examiner* — Michael Lebentritt
(74) *Attorney, Agent, or Firm* — Jacqueline J. Garner; Charles A. Brill; Frank D. Cimino

(57) ABSTRACT

High voltage integrated circuit capacitors are disclosed. In an example arrangement, A capacitor structure includes a semiconductor substrate; a bottom plate having a conductive layer overlying the semiconductor substrate; a capacitor dielectric layer deposited overlying at least a portion of the bottom plate and having a first thickness greater than about 6 um in a first region; a sloped transition region in the capacitor dielectric at an edge of the first region, the sloped transition region having an upper surface with a slope of greater than 5 degrees from a horizontal plane and extending from the first region to a second region of the capacitor dielectric layer having a second thickness lower than the first thickness; and a top plate conductor formed overlying at least a portion of the capacitor dielectric layer in the first
(Continued)

region. Methods and additional apparatus arrangements are disclosed.

20 Claims, 17 Drawing Sheets

Related U.S. Application Data division of application No. 14/933,638, filed on Nov. 5, 2015, now Pat. No. 9,525,021.

(60) Provisional application No. 62/076,176, filed on Nov. 6, 2014.

(51) Int. Cl.
*H01L 23/552* (2006.01)
*H01L 23/522* (2006.01)

(52) U.S. Cl.
CPC ........ *H01L 23/5223* (2013.01); *H01L 23/642* (2013.01); *H01L 2224/48463* (2013.01); *H01L 2224/49107* (2013.01)

(56) References Cited

U.S. PATENT DOCUMENTS

| | | | |
|---|---|---|---|
| 5,119,148 A | 6/1992 | Anderson et al. | |
| 5,920,088 A | 7/1999 | Augusto | |
| 7,413,947 B2 | 8/2008 | Larkin et al. | |
| 7,470,991 B2 | 12/2008 | Larkin et al. | |
| 7,560,332 B2 | 7/2009 | Lee et al. | |
| 7,652,349 B2 | 1/2010 | Kuwajima et al. | |
| 9,281,355 B2 | 3/2016 | Dirnecker | |
| 9,299,697 B2 | 3/2016 | West et al. | |
| 9,525,021 B2 * | 12/2016 | West | H01L 28/60 |
| 9,741,787 B2 * | 8/2017 | West | H01L 28/60 |
| 2004/0095978 A1 | 5/2004 | Cheng et al. | |
| 2005/0127417 A1 | 6/2005 | Saenger et al. | |
| 2006/0197091 A1 | 9/2006 | Huang et al. | |
| 2007/0131938 A1 | 6/2007 | Williams | |
| 2010/0091424 A1 | 4/2010 | Loh et al. | |
| 2010/0167424 A1 | 7/2010 | Howard et al. | |
| 2012/0241750 A1 | 9/2012 | Chikama et al. | |
| 2012/0280319 A1 | 11/2012 | Roehrer | |
| 2013/0043489 A1 | 2/2013 | Kotani et al. | |
| 2013/0075739 A1 | 3/2013 | Loy et al. | |
| 2014/0097516 A1 | 4/2014 | Dubois et al. | |
| 2014/0183698 A1 | 7/2014 | Hsu et al. | |
| 2015/0200245 A1 | 7/2015 | Yun et al. | |
| 2016/0197091 A1 * | 7/2016 | Hisamoto | H01L 21/28282 257/326 |

FOREIGN PATENT DOCUMENTS

| | | |
|---|---|---|
| CN | 104022073 A | 9/2014 |
| EP | 0874393 A2 | 10/1998 |
| RU | 2460164 C2 | 8/2012 |
| SU | 1607621 A1 | 9/1992 |

OTHER PUBLICATIONS

European Search Report, dated Jun. 18, 2018, PCT/US2015059627.
European Patent Office Search Report, dated Oct. 30, 2018, PCT/US2015059627.
State Intellectual Property Office of P.R.C. Search Report, referenced in First Office Action dated Feb. 3, 2020, Chinese Application No. 201580060054X.

* cited by examiner

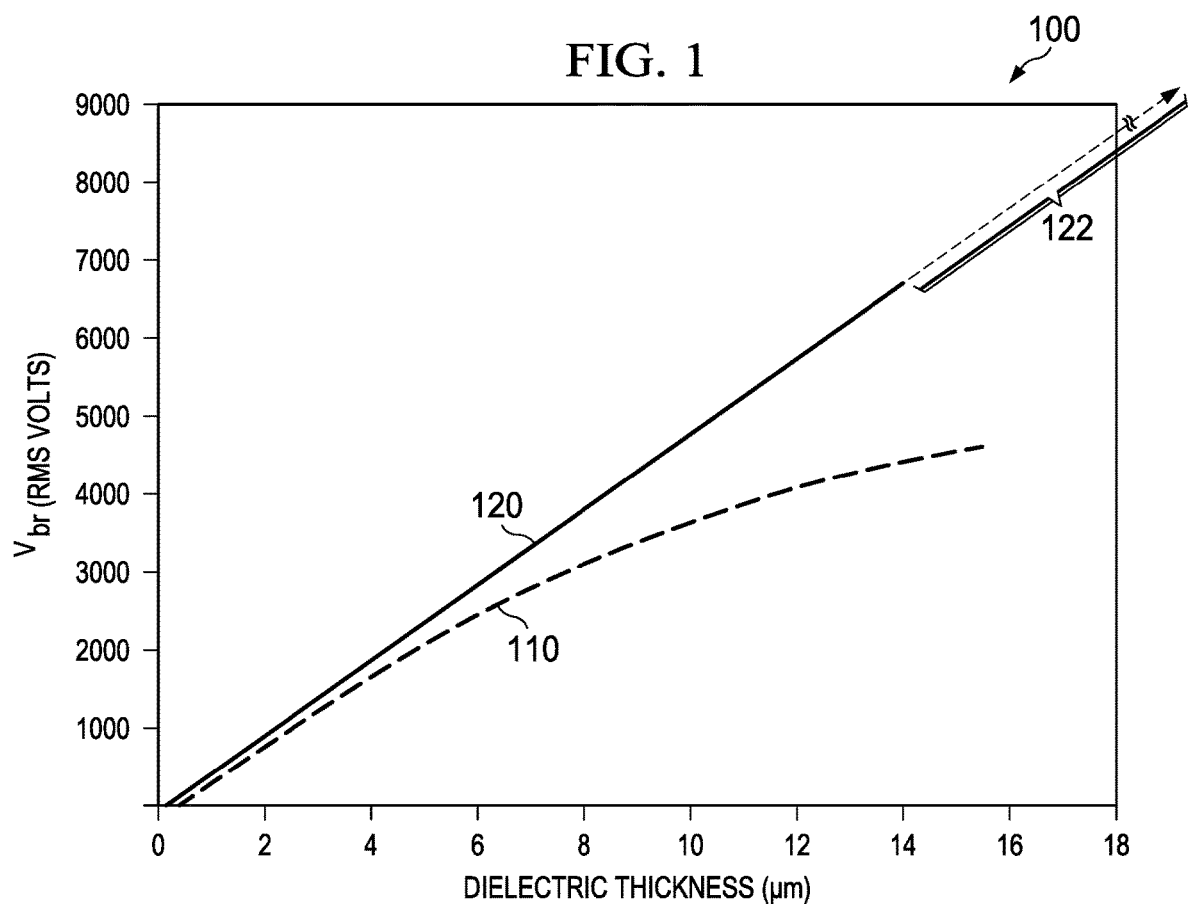

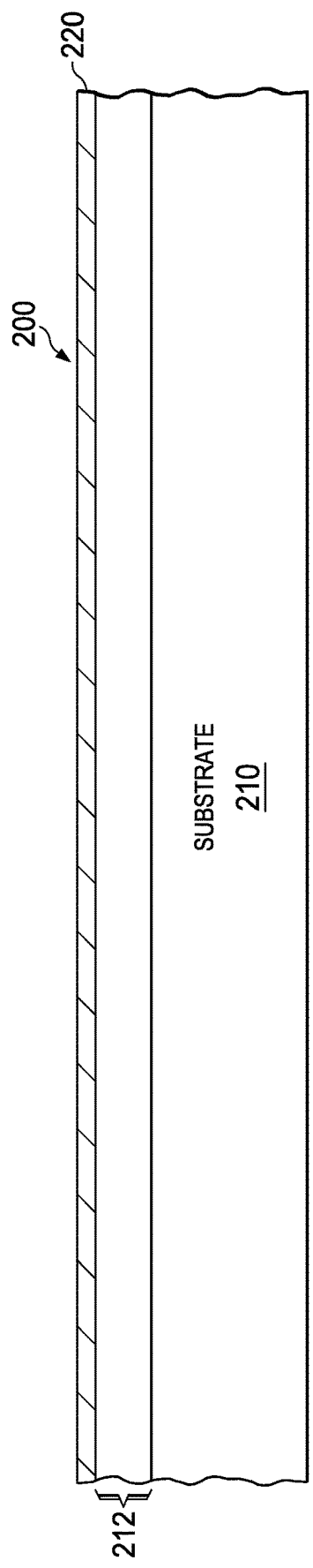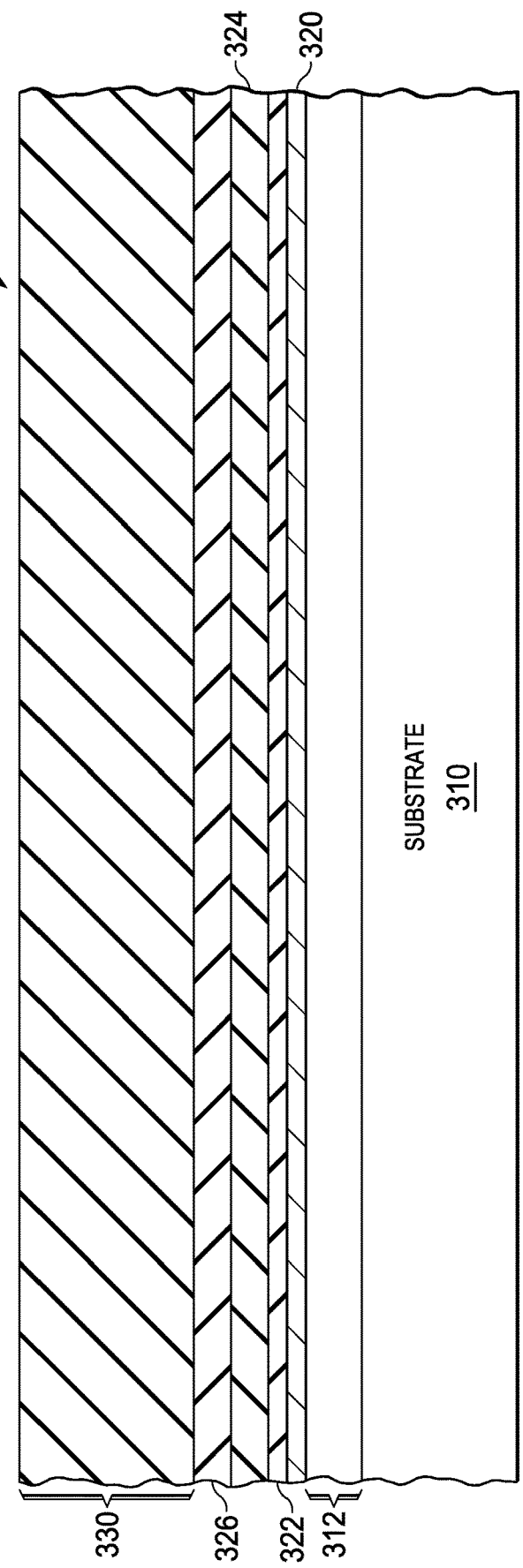

METHODS AND APPARATUS FOR HIGH VOLTAGE INTEGRATED CIRCUIT CAPACITORS

CROSS-REFERENCE TO RELATED APPLICATION

This application is a continuation of U.S. Nonprovisional patent application Ser. No. 15/348,698, filed Nov. 10, 2016, which is a divisional of U.S. Nonprovisional patent application Ser. No. 14/933,638, filed Nov. 5, 2015 (now U.S. Pat. No. 9,525,021), which claims the benefit of U.S. Provisional Application Ser. No. 62/076,176, filed Nov. 6, 2014, the contents of all of which are herein incorporated by reference in its entirety.

TECHNICAL FIELD

The present application relates in general to electronic circuitry and in particular to methods and apparatus for building integrated high voltage and extra-high voltage capacitors within a semiconductor manufacturing process.

BACKGROUND

In modern industrial equipment, computer controllers are being utilized in greater numbers of applications. The need for electrical isolation between the low voltage of controllers and the high voltage of motors or equipment is growing. Depending on the equipment being controlled, there are various known approaches used to isolate the systems electrically but that still allow electrical coupling. Isolation provides an AC path for signals or power between two circuits but eliminates direct connections. This is important where ground potential differences exist between nodes. Isolation is used to break the direct connection paths between the signal domains and to break the common ground loop, because noise can be transmitted through the ground loop that would otherwise interfere with the proper operation of the circuits. Known isolation approaches can include using a transformer to couple circuits magnetically, an RF signal to couple through a radiated energy, an opto-isolator using light energy, or using a capacitor between the two circuits that couples the circuits using an electric field. Other isolation needs include integration of analog and digital circuitry onto a single packaged integrated circuit with separate power domains, for example.

Although opto-isolators are a suitable solution for low speed communication applications, in other applications where isolation is required and an opto-isolator is not appropriate, a capacitor is needed. Capacitors provided on a circuit board or as part of the package for integrated circuits have been used for isolation, for example, U.S. Pat. No. 4,780,795, entitled "Packages for Hybrid Integrated Circuit High Voltage Isolation Amplifiers and Method of Manufacture," issued Oct. 25, 1988 to Meinel, discloses a hybrid package for integrated circuits that includes two silicon integrated circuit devices positioned within a package and the use of planar discrete capacitors formed on a ceramic substrate also within the package for isolation between the two silicon circuits. However as integration of circuits onto silicon continues to advance, isolators that can be formed on the semiconductor substrate with other circuitry, e.g., integrated capacitor isolators, are used and desired. To gain increased capacitance values for use with higher voltages, the capacitors used in the prior known approaches can be coupled serially, however, this approach requires additional silicon area. Integrated capacitors of values capable for high voltage isolation are therefore desired. These capacitors could be used serially to gain still higher capacitor values, or the isolation capacitors could be used to form discrete components as well as being used in integrated circuits with additional circuitry.

Within the present application and as currently described in the power circuits industry, low voltage is considered as below 50V, high voltage is defined as a voltage greater than 50 Volts and less than 5,000 volts. Extra-high voltage is a voltage greater than 5,000 Volts and less than about 20,000 Volts. Arrangements herein are directed at high voltage and extra-high voltage applications.

With the trend for miniaturization, control interfaces utilizing integrated capacitors for isolation are needed. Integrated capacitors provide the smallest solution for isolation and power circuit applications. However, in the prior known approach solutions, to create an integrated capacitor in the extra-high voltage range, greater than 5,000 Volts peak for example, the large capacitance needed has been formed by coupling two or more lower voltage capacitors in series. Increased capacitor values are therefore desired to further reduce the silicon area needed to achieve a particular isolation circuit solution.

The breakdown voltage of an ideal parallel plate capacitor is related to the dielectric strength and distance between the plates as shown in Equation 1:

$$V_{bd} = E_{ds} d \qquad \text{EQUATION 1}$$

Where:
$V_{bd}$=breakdown voltage; $E_{ds}$=dielectric strength and d=distance between plates Equation 1 illustrates that for a constant dielectric material, increasing the distance between the capacitor plates will linearly increase the breakdown voltage. In an integrated circuit, where two different metal layers may typically form the capacitor plates, the plate distance d is increased by increasing the dielectric thickness between the layers. However, in an integrated circuit process, a dielectric thickness increased to a distance sufficient for high voltage capacitors can also lead to wafer bowing or warpage, and to increase the dielectric thickness enough so that the $V_{br}$ is greater than 5,000 volts, the wafer warpage can become so pronounced that semiconductor processing equipment downstream from the dielectric thickening step is not able to properly process the wafers. In addition, in a known approach that uses the typical multiple level metal layer systems with inter-metal dielectrics to achieve a sufficiently thick dielectric for high voltage capacitors, the process of adding multiple layers of metal and oxide, then stripping away the unwanted metal areas so as to create the desired dielectric thickness results in electrical degradation of the capacitor. The additional process operations of forming metal, photoresist, etch, leveling/planarization such as chemical mechanical polishing (CMP) and clean-up cause increased defects and add extra costs to the production of the wafer, which are undesirable. However, in an integrated circuit process, increasing the dielectric thickness to a distance sufficient for high voltage and extra-high voltage capacitors has a number of challenges. Extremely thick layers of generally compressive dielectric films can lead to severe wafer warpage, such that semiconductor processing equipment downstream from the dielectric deposition step is not able to properly process the wafers. In addition, embedding additional metal levels for no reason other than to increase the dielectric thickness between bottom and top plates of the capacitor results in a significant cost increase related to the repeated processing loop of forming inter-level connection vias, then a patterned metal layer, then depositing and planarizing a dielectric material over the metal layer.

Continuing improvements are therefore needed for methods and apparatus to provide integrated high voltage and extra-high voltage value capacitors that can be manufactured using conventional semiconductor processing methods and with known equipment, and at a relatively low cost.

SUMMARY

An aspect of the present application provides methods and structures for a high voltage and extra-high voltage integrated circuit capacitor to address the deficiencies describe in existing art. In the arrangements, a thick capacitor dielectric structure is formed overlying a bottom plate and arranged to provide high voltage or extra high voltage integrated capacitor arrangements.

In an example arrangement, a capacitor structure includes a semiconductor substrate; a bottom plate including a conductive layer overlying the semiconductor substrate; a capacitor dielectric layer deposited overlying at least a portion of the bottom plate and having a first thickness greater than about 6 um in a first region; a sloped transition region in the capacitor dielectric at an edge of the first region, the sloped transition region having an upper surface with a slope of greater than 5 degrees from a horizontal plane and extending from the first region to a second region of the capacitor dielectric layer having a second thickness lower than the first thickness; and a top plate conductor formed overlying at least a portion of the capacitor dielectric layer in the first region.

In a further arrangement, the capacitor structure above wherein the capacitor dielectric layer is an oxide, and further including at least one layer of dielectric material formed between the capacitor dielectric layer and the bottom plate that further comprises at least one of silicon nitride and silicon oxynitride.

In still another arrangement, the capacitor structure above is provided wherein the capacitor dielectric layer is a monolithic layer formed in a single deposition step. In an additional arrangement, the capacitor structure described above is provided wherein the capacitor dielectric layer comprises an oxide formed by a TEOS deposition process. In a further alternative arrangement, in the capacitor structures above, the capacitor dielectric layer comprises multiple dielectric layers formed using multiple deposition steps.

In still another arrangement, in the capacitor structures described above, wherein the multiple dielectric layers are formed using multiple TEOS deposition steps.

In yet another alternative arrangement, in the capacitor structures described above, the capacitor dielectric layer includes multiple dielectrics formed as alternating compressive stress and tensile stress layers. In still a further alternative arrangement, in the capacitor structures described above, at least two of the multiple dielectric layers are formed using multiple TEOS deposition steps of silicon dioxide. In yet another arrangement, in the capacitor structures described above, a sum of the thicknesses of the capacitor dielectric layer and the at least one layer of dielectric is greater than about 8 ums. In still a further arrangement, in the capacitor structures described above, the capacitor dielectric layer has a thickness between about 6 ums and about 15 ums.

In still another alternative arrangement, in the capacitor structures described above, the capacitor dielectric layer further comprises an upper layer comprising silicon nitride and silicon oxynitride formed between the capacitor dielectric layer and the top plate conductor. In yet a further arrangement, in the capacitor structure described above the upper layer of the capacitor dielectric layer further comprises openings made in the upper layer.

In still a further arrangement, in the capacitor structures described above, the capacitor dielectric layer further comprises an area that is less than 35% of a total surface area of the semiconductor substrate. In an another alternative arrangement, in the capacitor structures described above, the capacitor dielectric layer further comprises an area that is between about 25% and about 35% of a total surface area of the semiconductor substrate.

In an example method arrangement, a method includes providing a semiconductor substrate; forming a capacitor bottom plate of conductive material overlying the semiconductor substrate; forming a capacitor dielectric layer overlying at least a portion of the capacitor bottom plate, the capacitor dielectric layer having a thickness of at least 6 ums; forming a gradient photoresist layer over the capacitor dielectric layer defining a first region in the capacitor dielectric having a first thickness and a defining a second region having a second thickness that is less than the first thickness; etching the capacitor dielectric layer to form the first region, the second region, and forming a transition region between the first region and the second region, the transition region having a sloped top surface with a slope from a horizontal plane greater than about 5 degrees; and forming a top plate conductor overlying at least a portion of the first region of the capacitor dielectric layer.

In still another arrangement, the method above is performed and further forming the capacitor dielectric layer includes forming in a single deposition step a monolithic capacitor dielectric layer that is one selected from the group consisting essentially of an oxide layer and an oxynitride layer.

In still another alternative arrangement, the methods above are performed and further include wherein forming in a single deposition step further includes performing a TEOS deposition. In a further alternative arrangement, in the methods above, forming the capacitor dielectric layer further includes forming the capacitor dielectric layer in a series of dielectric deposition steps to form multiple layers of dielectric. In still another arrangement, in the methods above, forming the multiple layers of dielectric comprises forming a series of layers each one selected from the group consisting essentially of an oxide layer and an oxynitride layer.

In yet another arrangement, in performing the methods described above, forming the capacitor dielectric layer further includes performing a series of dielectric deposition steps to form alternating compressive layers and tensile layers of dielectric.

In an additional alternative method, the methods above are performed and further include forming at least one insulating layer between the bottom plate and the capacitor dielectric layer, the insulating layer having a thickness of at least 1.5 ums.

In still another additional alternative arrangement, the methods described above are performed and include wherein a sum of the thicknesses of the capacitor dielectric layer and the thickness of the at least one insulating layer is greater than about 9 ums.

In a further method arrangement, the methods described above are performed and an area of the capacitor dielectric layer is less than 35% of a total area of the semiconductor substrate. In still another arrangement, the methods described above are performed and further comprising forming an upper layer over the capacitor dielectric layer that lies between the top of the capacitor dielectric layer and the top plate conductor, the upper layer comprising silicon nitride and silicon oxynitride. In still another alternative arrangement, the above methods are performed and further including forming openings in the upper layer by photolithographic pattern and etch processes.

In another example arrangement, an integrated circuit includes: a semiconductor substrate; at least one integrated isolation capacitor on the semiconductor substrate, the at least one integrated capacitor further including a bottom plate comprising a conductive layer overlying the semiconductor substrate; a capacitor dielectric layer deposited overlying at least a portion of the bottom plate and having a first thickness greater than about 6 ums in a first region, and having a second thickness less than the first thickness in a second region, and having a sloped transition region extending from the first region to the second region with an upper surface sloped at least 5 degrees from a horizontal plane; and a top plate conductor formed overlying at least a portion of the capacitor dielectric layer in the first region; at least one circuit coupled to the bottom plate of the at least one integrated capacitor; and an integrated circuit terminal coupled to the top plate of the at least one integrated capacitor and galvanically isolated from the at least one circuit by the integrated capacitor.

In still a further arrangement, the above described integrated circuit is provided wherein the at least one integrated capacitor further includes at least one layer of dielectric material disposed between the bottom plate and the bottom of the capacitor dielectric layer.

Use of the novel arrangements of the present application enable a single integrated circuit capacitor with dielectric thicknesses that allow for the breakdown voltages needed for high voltage and extra-high voltage capacitors and applications.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 1 is graph illustrating the effectiveness of a novel MESA process of the arrangements in creating high voltage and extra-high voltage capacitors;

FIG. 2 depicts in a cross-sectional view a portion of a high voltage or an extra-high voltage capacitor arrangement utilizing the novel MESA structure formation after initial processing;

FIG. 3 depicts in another cross-sectional view a portion of a high voltage or an extra-high voltage capacitor utilizing the MESA formation arrangement as in FIG. 2 at a subsequent processing step;

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 4:
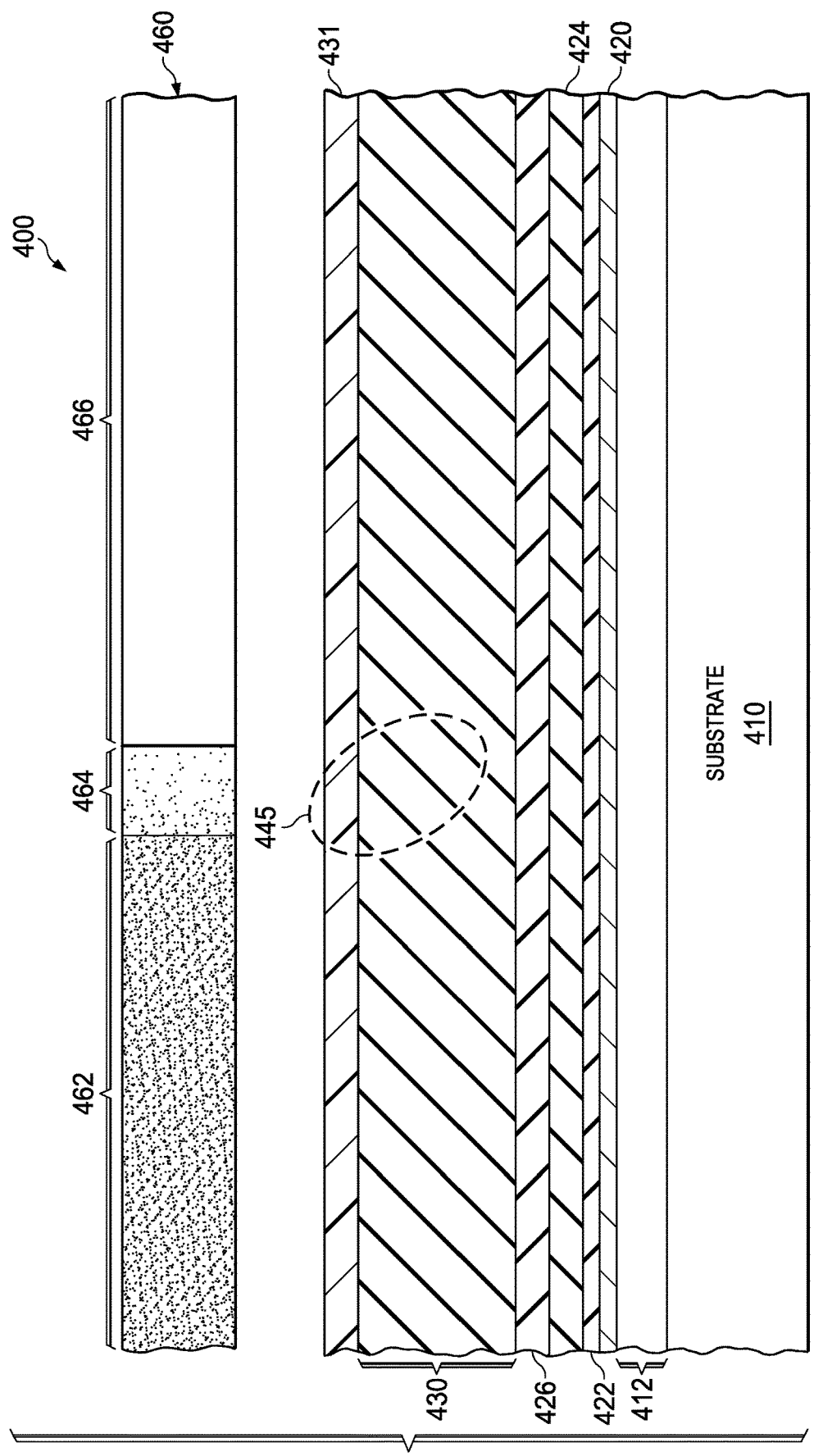
FIG. 4 depicts in another cross-sectional view a portion of a high voltage or an extra-high voltage capacitor utilizing the MESA formation arrangement as in FIG. 3 at a subsequent processing step, ready for the MESA etch.

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

An aspect of the present application provides for methods and apparatus to fabricate a high voltage or extra-high voltage integrated capacitor on a wafer within a semiconductor fabrication process flow. The fabrication technique utilizes a thick dielectric layer, called a "MESA" formation, formed in the upper portions of a semiconductor wafer, and the thick capacitor dielectric is used to increase the distance between the capacitor plates on the wafer. Because the thick dielectric layer is vertically above the remainder of the surface of the substrate and has a flat upper surface, it appears as a mesa shape. In the fabrication of the MESA capacitor, only standard semiconductor processes used in current production are utilized and an advantageous aspect of the present application is the ability to integrate the high voltage capacitor within standard wafer production processes. Throughout the detailed description, well known processes or operations are identified but not shown in full detail to prevent from obscuring the aspects of the present application. One skilled in the relevant art will recognize that aspects of the present application can be fabricated without one or more of the specific details or by using another known method in a fabrication step. The inventors of the present application contemplate alternative arrangements that can be formed in addition to the example arrangements described for illustration purposes herein, and these alternatives form additional novel arrangements that are contemplated as providing additional aspects of the present application, and these alternative arrangements fall within the scope of the appended claims. The additional capability of the MESA dielectric structures of the arrangements to increase the breakdown voltage of the capacitors is a key feature of the arrangements and is illustrated in FIG. 1.

FIG. 1 is a graph 100 illustrating the effectiveness of the MESA process in creating high voltage and extra-high voltage capacitors. In FIG. 1, the vertical axis plots the breakdown voltage ($V_{br}$) in Volts RMS, the horizontal axis plots the capacitor dielectric thickness in um, where 1 um=10,000 A (Angstroms). In graph 100, three data sets are illustrated: line 110 represents the $V_{br}$ of an available integrated high voltage capacitor; line 120 represents the current known art in high voltage integrated circuit capacitors and extra-high voltage integrated capacitors as designed using prior approaches, and dotted line 122 indicates an extension of line 120 that is enabled due to the use of the novel MESA structures and arrangements of the present application.

Data line 110 illustrates a dielectric that is the product of building multiple layers of dielectric/metal layers (using a typical multiple level metal process) but with the intervening metal layers removed so as to form a dielectric stack. The etching of metal away between the dielectric layers (the metal being part of the conventional multiple level metal structure for integrated circuits formed in the semiconductor process) has a cumulative degradation to the breakdown voltage $V_{br}$. The degradation is indicated by the data line 110 not being linear, but instead moving closer to the horizontal axis as the dielectric thickness increases. Line 120 illustrates the breakdown voltage $V_{br}$ for the high and extra-high voltage integrated circuit capacitors formed using known approaches to forming a single layer dielectric, and the dotted line 122 represents the improvement in $V_{br}$ due achieved due to the increased thickness that is enabled by the use of the novel MESA structures of the present application, described in further detail below. The graph in FIG. 1 thus illustrates that by using the arrangements of the present application, increased breakdown voltages for a single integrated capacitor which were previously unattainable can now be attained.

Throughout this application, many acronyms familiar to the semiconductor industry are used. Some of those are IC (integrated circuit), CMP (Chemical Mechanical Polish), CVD (chemical vapor deposition), PECVD (Plasma Enhanced CVD), HDP (high density plasma), PO (Protective Overcoat) and TEOS (silicon oxide formed from a tetraethylorthosilicate source).

FIG. 2 depicts in a cross-sectional view a first step in a series of example process steps described herein for illustrating a non-limiting, example approach to forming a high voltage or extra-high voltage capacitor utilizing the MESA structure and methods of the present application. FIG. 2 illustrates in a cross section 200 a structure shown at the beginning of the formation of the bottom capacitor plate. For continuity, the base numbers of the layers will be preserved in subsequent figures. Depicted in FIG. 2 is a semiconductor substrate 210, the processing layers 212 that have been deposited in prior conventional semiconductor processing steps, and the metal layer 220 which will become a bottom capacitor plate in the final capacitor arrangement. In the layer 212, the prior processing steps may form various devices (not shown for simplicity) in the substrate and interconnect them, such as transistors including MOS transistors, bipolar transistors, FETs, diodes, resistors, inductors, capacitors and the like. These components can be interconnected using metal layers and inter-metal dielectric layers, the metal layers being connected to one another and to the substrate using via and contacts to connect the layers as are known to those skilled in the art.

The versatility of the MESA structure of the arrangements of the present application allows the capacitor structure to be built on different semiconductor fabrication processes containing as few as two levels of metal and as many as eight or more levels of metal. The initial or bottom capacitor plate can be formed within any of the metal levels fabricated during the semiconductor processing of the layers 212 or 220. In the non-limiting example illustrated here, the MESA structure will be fabricated utilizing the top level metal 220 as the bottom capacitor plate. Metal layer 220 can be, for example, aluminum or copper or alloys thereof, the metal being the one used in the particular semiconductor fabrication process. Single and dual damascene copper or copper alloy materials can be used to form metal layer 220.

FIG. 3 depicts in another cross sectional view 300 a high voltage or an extra-high voltage capacitor utilizing the MESA formation at a subsequent step, at a stage ready for the MESA dielectric layers. For continuity, the base numbers have been preserved from the previous figure only incrementing the left digit to "3" including the substrate 310, the prior processing layers 312 and the top level metal bottom capacitor plate 320.

At this stage of processing in FIG. 3, on the top metal plate 320 an optional migration barrier 322 can be applied at a thickness in the range of 800 A to 1100 A. In one example arrangement the layer 322 can be silicon nitride formed using known deposition processes such as CVD or by a HDP process. Alternatives include SiCN layers and other dielectrics used as barrier layers. The next layer shown in the cross section 300 is a silicon dioxide layer 324. This may be referred to as the "sub-ESL" layer, as it lies beneath an etch stop layer or ESL. In an example arrangement this layer can be approximately 2500 A to 4500 A thick and can be applied by known oxide deposition processes. In the non-limiting illustrative example depicted in FIG. 3, etch stop layer 326 follows and can be formed approximately 2500 to 4500 A thick by known processes. Etch stop layers are chosen so that selective etch chemistry of the overlying layer (to be described next) can be used. Etch stop layer 326 can be formed of SiON, for example, or oxynitride, or another dielectric that differs from the MESA dielectric layer to be formed next, so that a selective etch of silicon dioxide MESA material (described below) can be performed.

At this point in the fabrication the thick primary MESA TEOS layer 330 is applied to the wafer using known processes such as CVD or PECVD. In this non-limiting example arrangement, a simple and cost effective method is to deposit a single thick layer of TEOS silicon oxide. The thickness of the primary MESA TEOS layer 330 can be determined by the evaluating the desired breakdown voltage Vbr required and the thickness of layer 330 can be limited by the amount of temporary wafer bow or wafer warpage that can be tolerated in the semiconductor fabrication process. For tuning the breakdown voltage, the primary MESA TEOS layer 330 may be applied in a range of approximately 6 um to 20 um (60,000 A to 200,000 A) thick with thicker layers providing the highest breakdown voltage and also carrying the highest risk for wafer warpage. However forming a single deposition layer of the required thickness in a single processing step, while practical, can impose difficulties on the processing equipment. For example, if a single TEOS deposition of more than 8 ums is performed in one deposition step, a layer of silicon oxide of the same thickness deposits on the walls of the processing chamber. This wall oxide has to be removed from the process chamber using a plasma etch and clean process, which can be quite lengthy when the wall oxide is of this thickness, affecting tool downtime and throughput rate in the semiconductor processing facility or tool. The inventors of the present application contemplate that the primary MESA TEOS layer 330 can be, in some alternative arrangements of the present application, applied in thinner layers in a sequence of deposition steps. In another alternative arrangement that is also described below, the layers can be applied in successive layers of compressed and tensile stressor oxide layers formed in multiple deposition steps to help mitigate the amount of wafer warpage. Further, the inventors contemplate additional arrangements wherein the TEOS layer 330 can be formed using a process of successive, thinner oxide deposition steps with cooling steps between the oxide depositions, improving wafer bow effects and reducing stress on the wafer. These alternative arrangements are also further described in detail below.

The thickness of the total dielectric required for a particular capacitance value influences the amount of wafer bow or warpage that will occur and impacts the decision about whether to use single or multiple dielectric layers in creating the primary MESA TEOS layer 330.

FIG. 4 depicts in another cross sectional view 400 a portion of a high voltage or extra-high voltage capacitor utilizing the MESA formation, at a subsequent processing stage now ready for photoresist exposure to prepare the MESA etch. For continuity, the base numbers of the layers have been preserved from the previous figures only incrementing the left digit to "4" including the substrate 410, the prior processing layers 412, the bottom capacitor plate 420, the metal diffusion barrier 422, the initial MESA oxide layer 424, the etch stop layer 426 and the primary MESA TEOS layer 430. A photoresist layer 431 is shown deposited over the MESA layer 430.

At the stage of the processing in FIG. 4 the thick primary MESA layer 430 may be causing some wafer warpage because of its thickness. Since the eventual MESA area only requires about 15% to 35% of the total wafer area, etching away the unneeded MESA TEOS material 430 will relieve the stress on the wafer, reducing the wafer warpage which will allow subsequent semiconductor processing to proceed without issues from the warpage. However, an etch that leaves a stepped or steep edge at the MESA boundary could also cause subsequent processing steps to leave metal fragments near the MESA edge, which will facilitate premature voltage breakdown. To alleviate this issue, a sloped edge on the MESA is formed in the area labeled 445. To enable this sloped area, a photomask 460 is utilized where the area above the MESA (462) is fully chromed and the area where no MESA material is desired is fully clear (466). The transition between the areas 462 and 466 on the photomask is a dithered area (464) where the side closest to 462 would have full chrome and the area closest to 466 would have no chrome in the pattern. When used to develop photoresist 431 and then a subsequent oxide etch is performed using the resulting resist pattern, this essentially causes an etch "gradient" across the area 445 which leaves a sloped edge on the thick MESA oxide area after etch. Utilizing a mask of this description, the photoresist 431 is exposed and patterned, and then the MESA material 430 is etched with known photoresist and etch processes leaving a slope in area 445. In some example arrangements the slope can be as low as 5-6 degrees slope from the horizontal. In other alternative arrangements a higher slope of between 5-30 degrees can be used.

Figure 5:
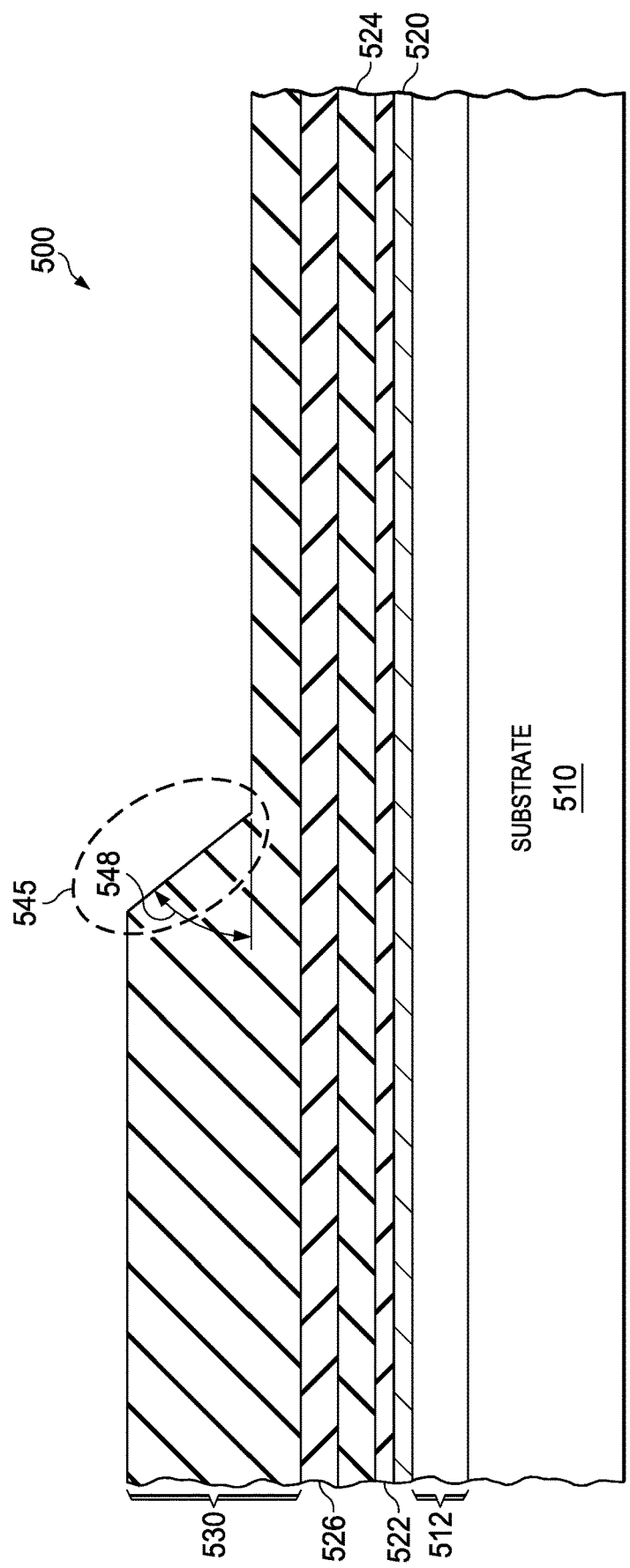
FIG. 5 depicts in another cross-sectional view a portion of a high voltage or an extra-high voltage capacitor utilizing the MESA formation arrangement as in FIG. 4 at a subsequent processing step, after an etch step.

FIG. 5 depicts in another cross sectional view 500 a portion of a high voltage or extra-high voltage capacitor formed utilizing the MESA processes, now shown after the MESA oxide etch described above is performed For continuity, the base numbers of the layers have been preserved from the previous figure only incrementing the left digit to "5" including the substrate 510, the prior processing layers 512, the buried capacitor plate 520, the metal barrier 522, the initial Mesa oxide layer 524, the optional etch stop layer 526 and the primary MESA TEOS layer 530 showing the sloped edge transition in region 545.

Depicted in FIG. 5 is the sloped transition region 545 now formed in the layer of primary MESA TEOS material 530. The approximate desired angle 548 to enable the subsequent etches and processing to work effectively can be from approximately 5 degrees to approximately 30 degrees from the horizontal plane. (Note that the figures are for illustration and explanation purposes and are not drawn to scale).

Figure 6:
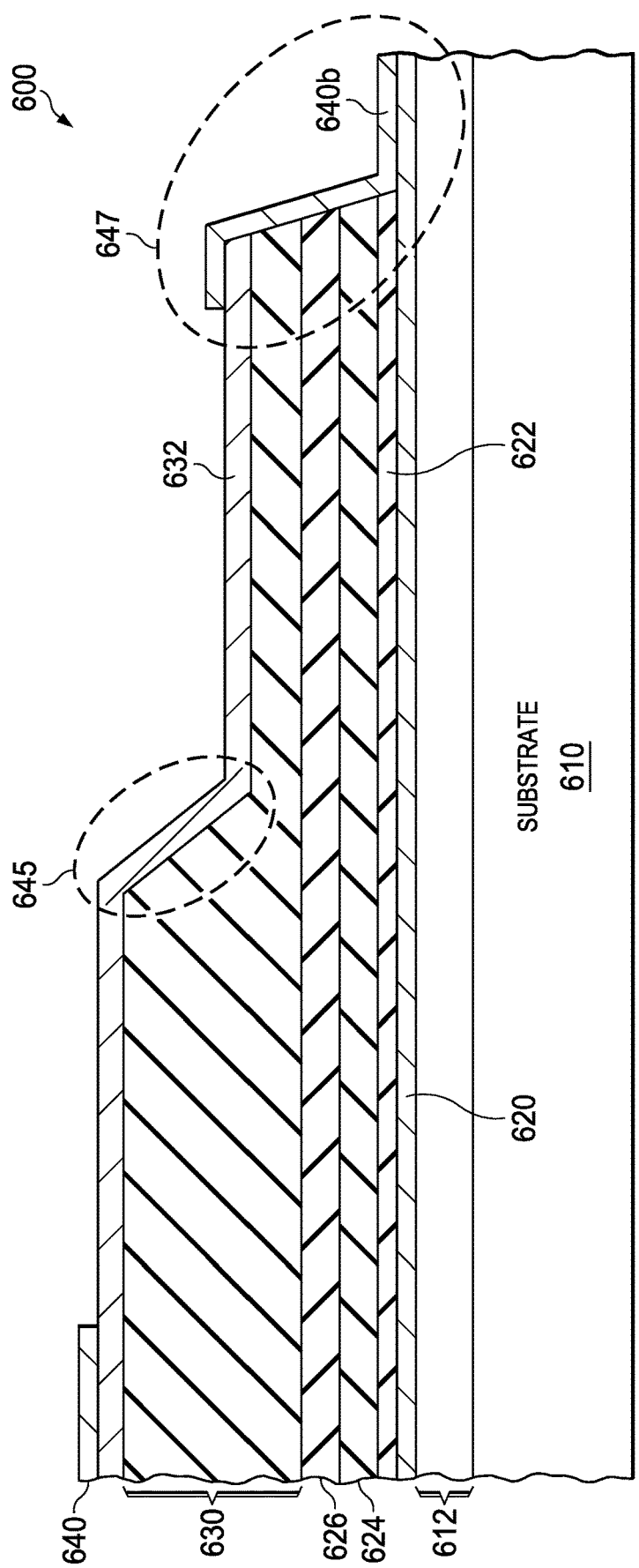
FIG. 6 depicts in a further cross-sectional view a portion of a high voltage or an extra-high voltage capacitor utilizing the MESA formation arrangement as in FIG. 5 at a subsequent processing step, illustrating the formation of the top capacitor plate.

FIG. 6 depicts in another cross section 600 a high voltage or extra-high voltage capacitor utilizing the MESA formation at a subsequent processing step, illustrating the top capacitor plate metal deposition. For continuity, the base numbers of the layers have been preserved from the previous figure only incrementing the left digit to "6" including the substrate 610, the prior processing layers 612, the bottom capacitor plate 620, the metal barrier 622, the initial MESA oxide layer 624, the etch stop layer 626 and the primary MESA TEOS layer 630 with sloped edge in region 645.

At this stage of the fabrication, in FIG. 6 an optional layer for improving performance of the MESA capacitor structure 632 is applied over the primary MESA TEOS layer 630. This layer and the methods for forming the layer is described in a co-owned pending patent application, U.S. patent application Ser. No. 14/277,851, entitled "HIGH BREAKDOWN VOLTAGE MICROELECTRONIC DEVICE ISOLATION STRUCTURE WITH IMPROVED RELIABILITY," filed on May 5, 2014, which is hereby incorporated in its entirety by reference herein. Layer 632 is a dielectric layer that can be formed from at least a pair of sub-layers, the first sub-layer formed on the MESA capacitor dielectric can be a silicon oxide nitride (oxynitride), and a second sub-layer formed on the capacitor dielectric can be a silicon nitride layer. As is shown below, dielectric layer 632 can be patterned after deposition as described in the above referenced patent application to form an opening spaced laterally from a top plate conductor, thereby reducing leakage current and also reduces an electric field at the corners of the top plate conductor. The layer 632 conforms to the upper surface of the MESA dielectric 630 and has the same sloped shape in region 645 as the MESA dielectric layer 630.

After layer 632 is formed, which if it includes both the layers described above can be described as a "bi-layer" dielectric, an etch step can be performed to create bond pad openings in the dielectric layers at areas away from the thick MESA dielectric portion of 630, such as in region 647 in FIG. 6.

A top plate conductor 640 is shown in FIG. 6 is then disposed over the optional dielectric layer 632 and the bond pad opening in region 647, which portion of the top plate metal numbered 640b contacts lower plate 620. The top plate conductor 640 can be an aluminum cap layer that is sputtered on the wafer or substrate, for example. Following the formation of the optional dielectric layer 632, the top level metal 640 is applied to the wafer approximately to a thickness between 7000 A to 12000 A. The top metal 640 can be, in one example method, sputtered on the wafer, patterned and then etched to leave the top capacitor contacts. The top metal is generally comprised of at least two metal layers, a refractory metal barrier layer such as TiN, TiW, or TaN, and then an aluminum, aluminum-copper alloy, or a copper layer. Because the edge of the MESA 630 was sloped in the prior etch, as shown in region 645, and especially for the case of metal removal by RIE anisotropic etch processing, the subsequent etch is able to effectively clear the sloped area of the top level metal, thus not leaving any metal fragments that might otherwise concentrate the electric field within the capacitor, possibly leading to premature voltage breakdown.

Top level metal 640 can be an aluminum, a copper, or layers of both aluminum and copper as is known in the art. Top level metal 640 will comprise at least 2 layers, first of which is a barrier refractory metal such as TiN, TiW, TaN, and the overlying metal is typically either a sputtered Al alloy such as Al-0.5 at % Cu or electroplated Cu. A bond pad (not shown in these figures for simplicity) that is typically of metal including copper, gold, nickel and alloys of these, is then formed to provide a terminal for the top plate 640 of the capacitor. After the top plate metal is formed, it is patterned to separate the top plate portion 640 from the bottom plate bond pad portion 640b. Bond wires or other connectors can then be attached to enable connection to the capacitor plates. Alternatives include making connections to other components in the package or on the integrated circuit. In an arrangement, the top plate is a high voltage terminal and is coupled by a bond pad and ball bond connector to an external circuit, while the bottom plate 620 and bond pad 640b can be coupled to low voltage circuitry that can be, in one example arrangement, disposed on the same substrate 610 to form an integrated circuit. In other arrangements, the bottom plate 620 and bond pad 640b can also be coupled to other circuitry using another ball bond connection.

Figure 7:
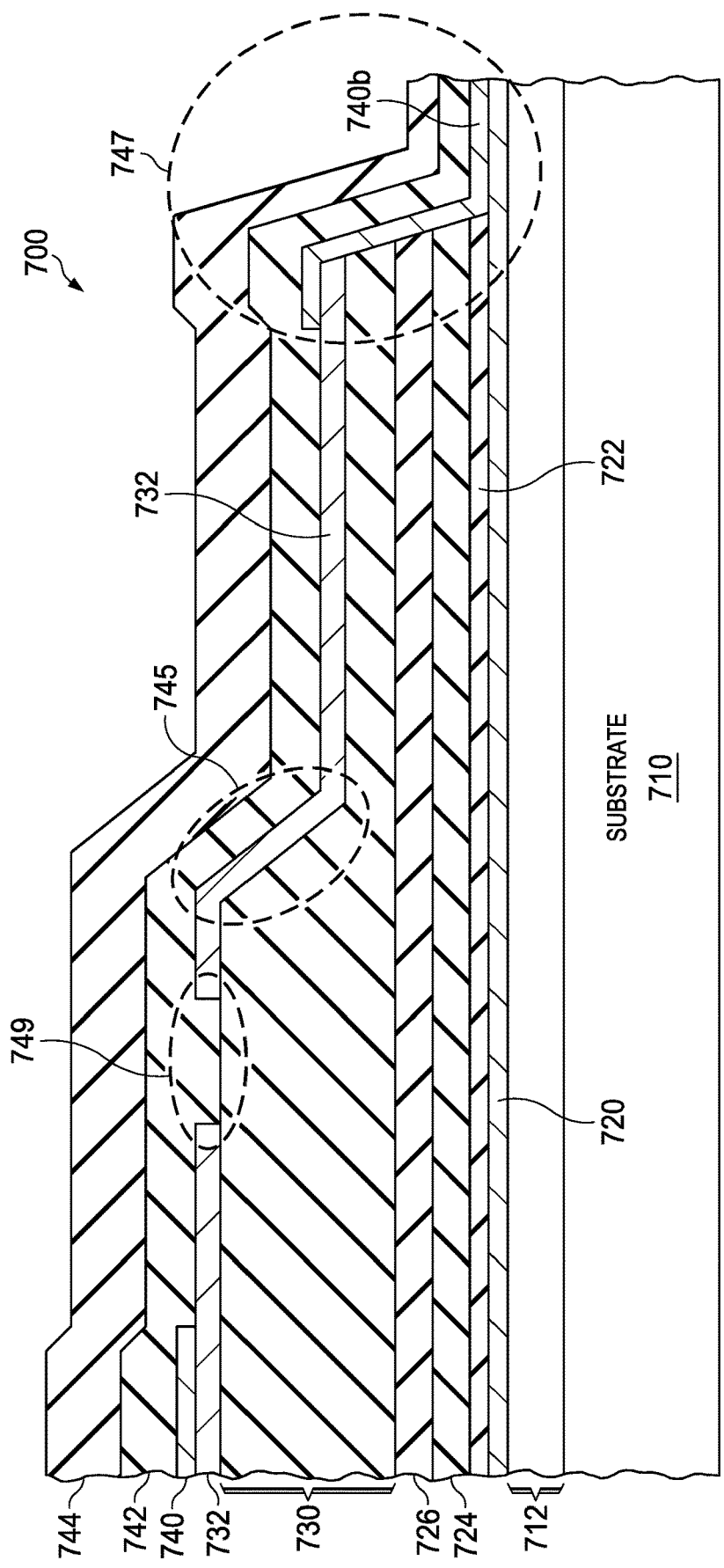
FIG. 7 depicts in a further cross-sectional view a portion of a high voltage or an extra-high voltage capacitor utilizing the MESA formation arrangement as in FIG. 6 after depositing a passivation overcoat oxide/SiON bilayer.

FIG. 7 depicts in another cross section 700 a portion of an arrangement including a high voltage or extra-high voltage capacitor utilizing the MESA formation at a later processing stage and illustrates the PO formation. For continuity, the base numbers of the layers in FIG. 7 have been preserved from the previous figure only incrementing the left digit to "7", including the substrate 710, the prior processing layers 712, the bottom capacitor plate 720, the metal barrier 722, the initial MESA oxide layer 724, the optional etch stop layer 726, the primary MESA TEOS layer 730, optional dielectric 732, and the top plate metal 740 and bottom plate contact 740b. The sloped region 745 is in the transition from the thicker MESA portion, to the thinner portion, of the capacitor structure. An opening in region 749 is shown formed in the optional dielectric layer 732 by pattern and etch photolithography steps as is described in the above referenced patent application, to increase performance. However, in an alternative arrangement, the layer 732 may be omitted.

At this stage of the fabrication, in FIG. 7 a first layer of a protective overcoat (PO) 742 usually consisting of silicon dioxide can be deposited on the wafer to a thickness between approximately 0.8 um to about 2.2 um thick. Next, without any CMP, a second PO layer 744 consisting of silicon oxynitride is applied approximately 0.7 um to 3 ums thick. Both of these layers remain as conformal coating layers without planarization. This novel approach is important to the processing of the arrangements since the MESA structures are still too thick for the use of CMP to level the wafer surface without also cutting into the MESA structure. Accordingly, no CMP is used on these PO layers.

Figure 8:
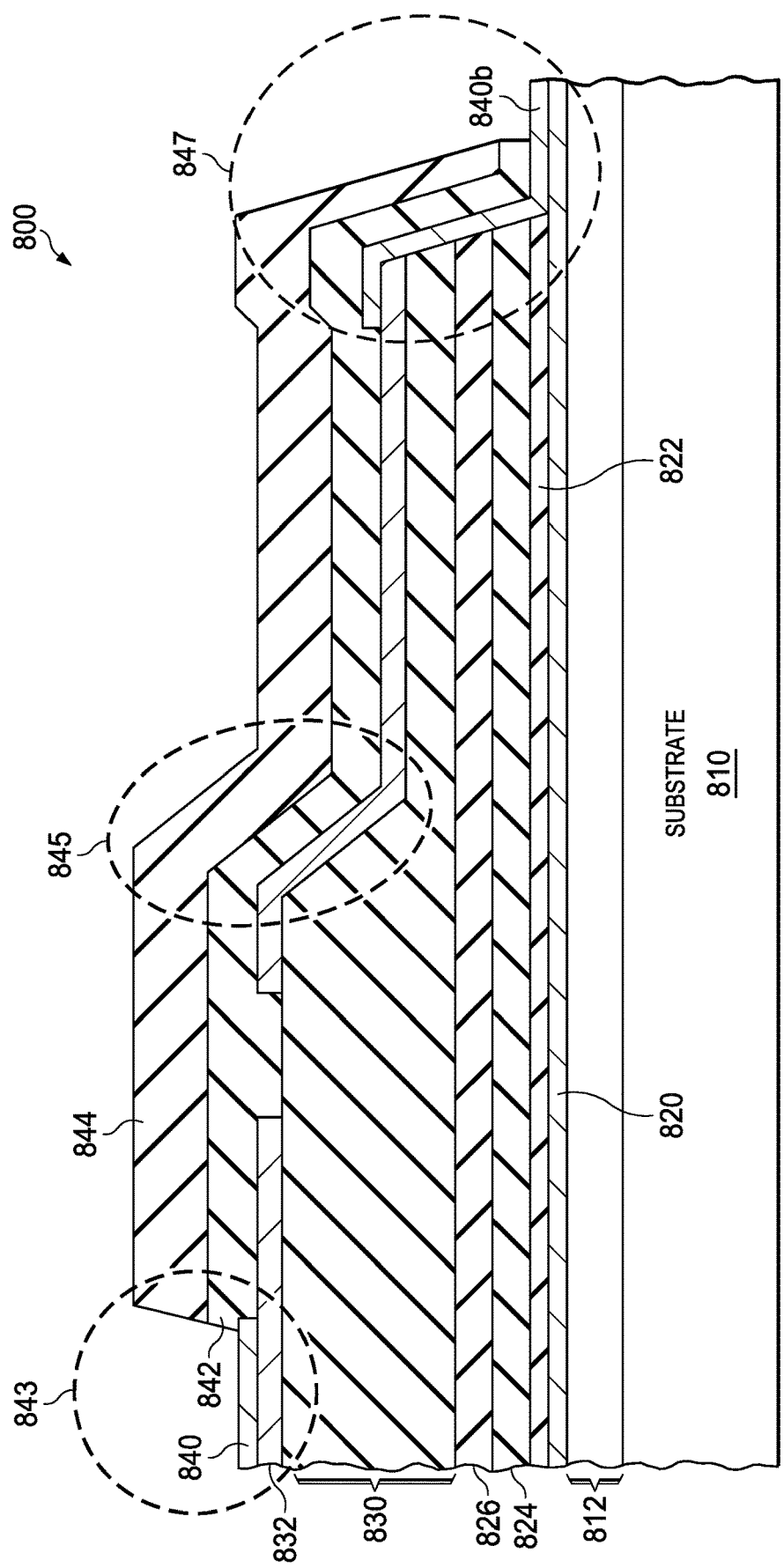
FIG. 8 depicts in a further cross-sectional view a portion of a high voltage or an extra-high voltage capacitor utilizing the MESA formation arrangement as in FIG. 7 after preferentially removing the passivation overcoat from the regions where wire bonds (or other bonding method) will be formed.

FIG. 8 depicts in another cross section 800 a high voltage or extra-high voltage capacitor arrangement utilizing the MESA formation at a subsequent processing stage and illustrates formation of bond wire openings in the PO layers deposited in the step of FIG. 7. For continuity, the base numbers of the layers have been preserved from the previous figure, only incrementing the left digit to "8" including the substrate 810, the prior processing layers 812, the bottom capacitor plate 820, the metal barrier 822, the initial MESA oxide layer 824, the optional etch stop layer 826, the primary MESA TEOS layer 830, the dielectric layer 832, the top plate conductor 840, the $1^{st}$ PO layer 842 and the $2^{nd}$ PO layer 844. The sloped transition region is shown as element 845. A lower plate bond area is formed by conductor 840b. PO layers 842, 844 follow the sloped surface of the previous layers in region 845, and these layers follow the sloped wall of the conductor 840b in region 847. The top plate 840 is exposed in region 843 for forming a bond pad or other terminal contact.

Figure 9:
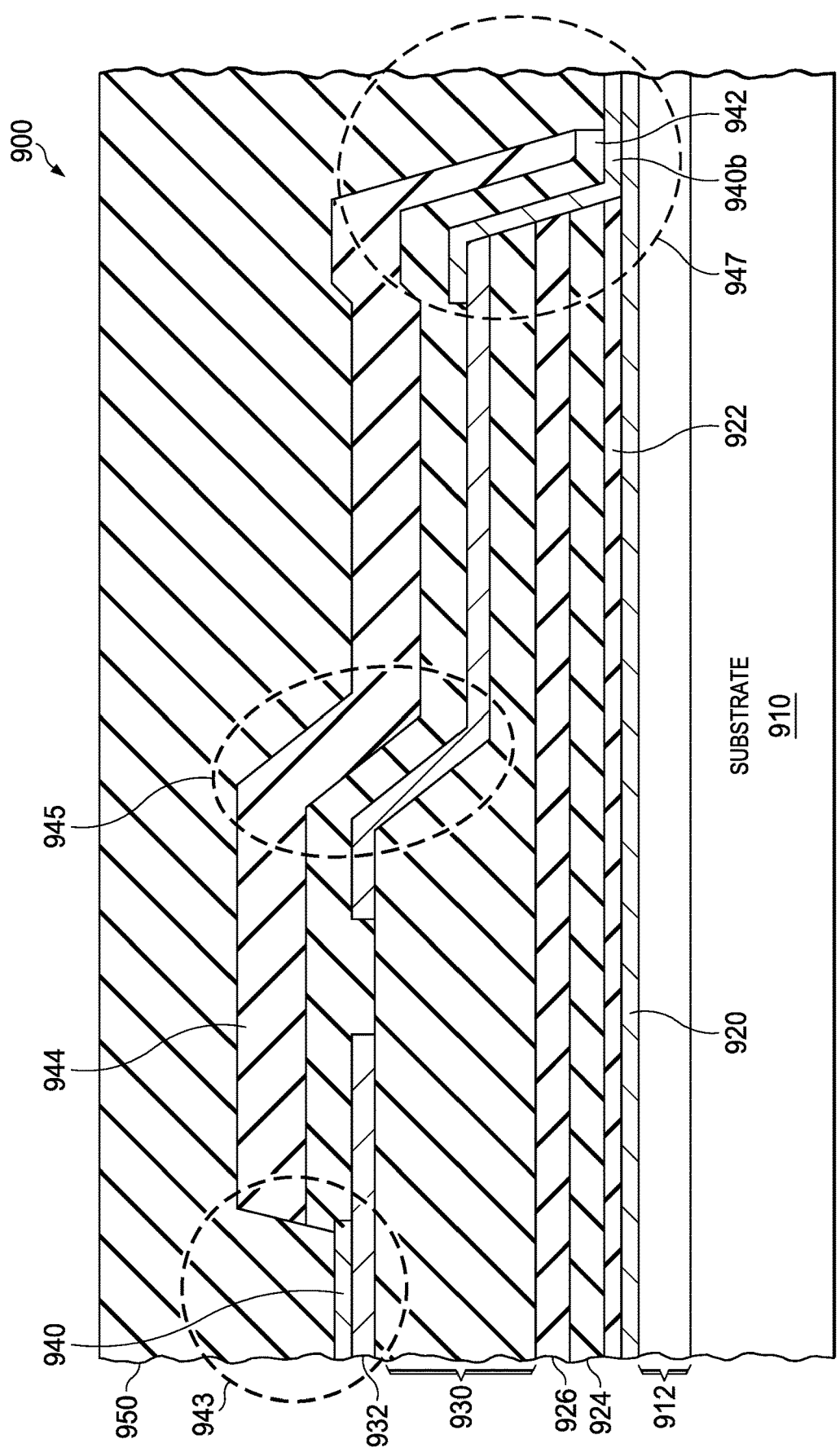
FIG. 9 depicts in another cross-sectional view of a high voltage or an extra-high voltage capacitor utilizing the MESA formation arrangement as in FIG. 8 at a subsequent processing step, ready for polyimide pattern.

FIG. 9 depicts in another cross section 900 of a high voltage or extra-high voltage capacitor arrangement utilizing the MESA formation such as is shown in FIG. 8 at a subsequent processing stage now ready for PI pattern and etch. For continuity, the base numbers of the layers have been preserved from the previous figure only incrementing the first digits to "9" including the substrate 910, the prior processing layers 912, the bottom capacitor plate 920, the metal barrier 922, the initial MESA oxide layer 924, the etch stop layer 926, the primary MESA TEOS layer 930, the optional dielectric layer 932, the top capacitor plate 940 and lower plate contact 940b, the 1$^{st}$ PO layer 942, the 2$^{nd}$ PO layer 944 and a top polyimide or PI layer 950. The sloped transition region is shown as element 945.

Figure 10:
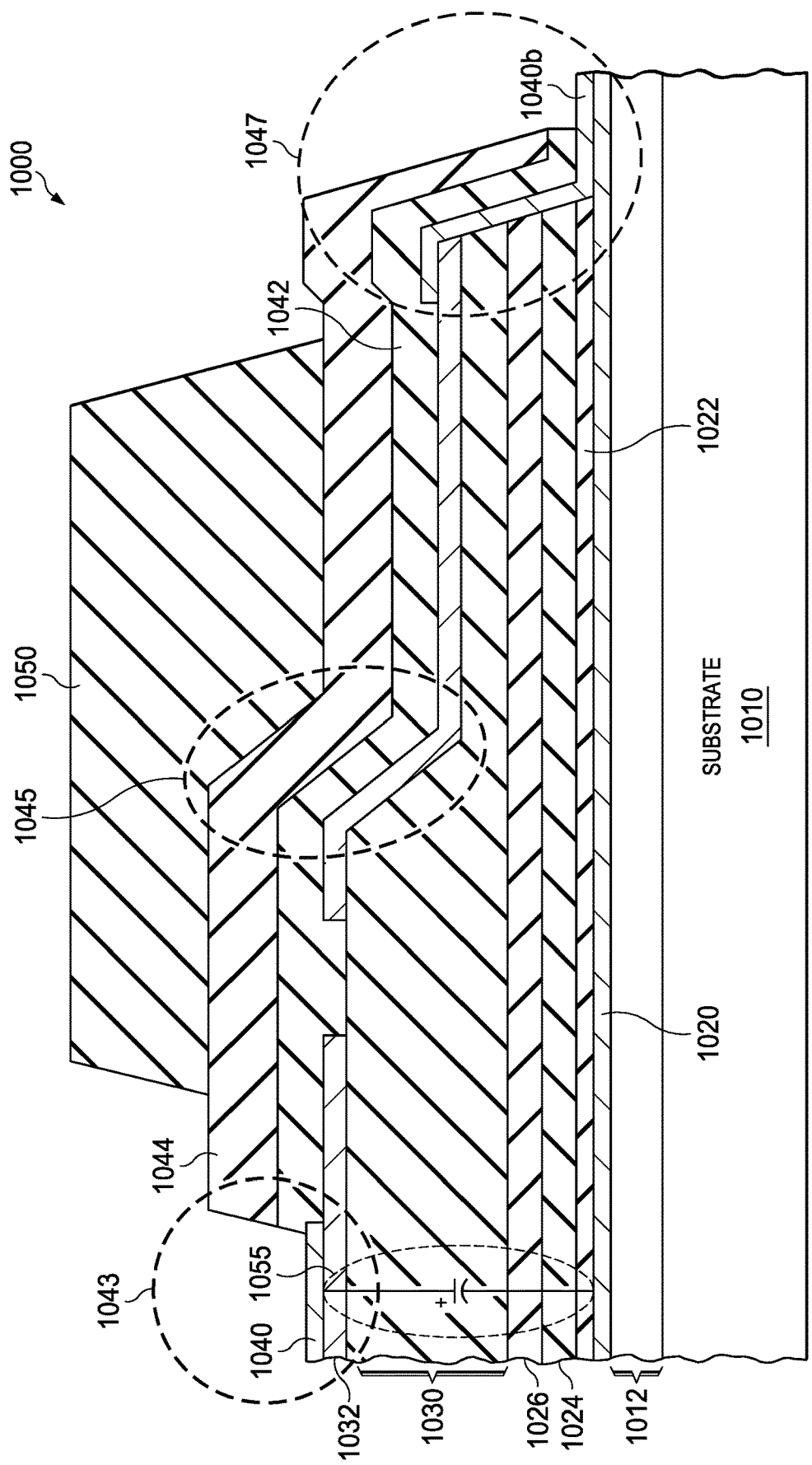
FIG. 10 depicts in another cross-sectional view a completed high voltage or extra-high voltage capacitor utilizing the novel MESA formation of the arrangements.

FIG. 10 depicts in another a cross section 1000 a completed high voltage or extra-high voltage capacitor arrangement utilizing the novel MESA formation processes of the present application. For continuity, the base numbers of the layers have been preserved from the previous figure only incrementing the left digit to "10" including the substrate 1010, the prior processing layers 1012, the bottom capacitor plate 1020, the metal barrier 1022, the initial MESA oxide layer 1024, the etch stop layer 1026, the primary MESA TEOS layer 1030, the optional dielectric layer 1032, the top capacitor plate conductor 1040 shown exposed in region 1043, the 1$^{st}$ PO layer 1042, the 2$^{nd}$ PO layer 1044 and the top PI layer 1050, and the bottom plate contact area 1040b in region 1047. In an example arrangement, the top metal plate is a bilayer sputtered film consisting of TaN and A 10.5% Cu layer. This forms the upper plate of the capacitor.

In FIG. 10, the capacitor symbol 1055 illustrates where the capacitor is formed with the bottom capacitor plate 1020 serving as the first terminal and the top capacitor plate 1040 serving as the second terminal. The MESA structure thickness 1030 is clearly the dominating dimension for separating the capacitor plates, providing (along with layer 1032, and the layers 1026 and 1020), a dielectric thickness "d" which in turn predicts the capacitor breakdown voltage as shown in Equation 1.

Figure 11:
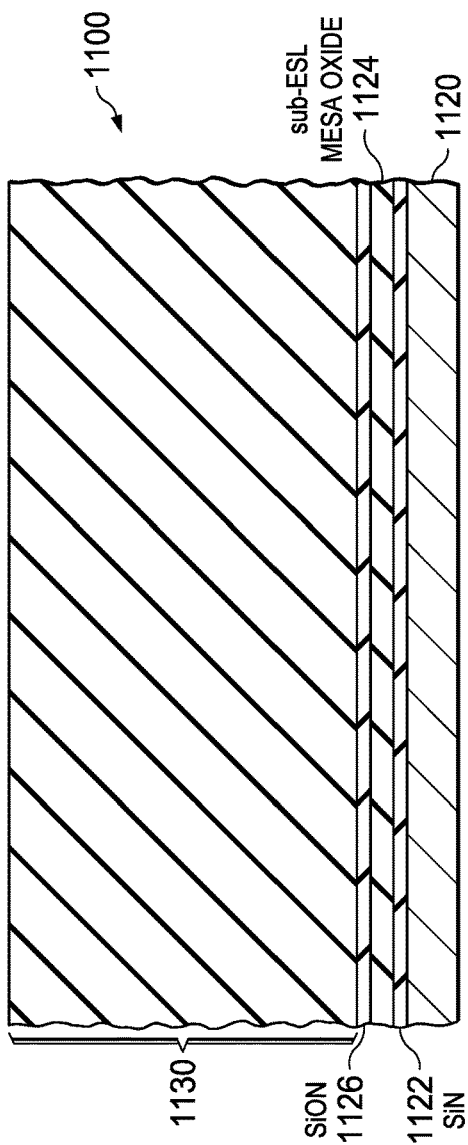
FIG. 11 depicts in a cross sectional view a portion of a high voltage capacitor dielectric using the MESA structure of the arrangements, illustrating a single oxide deposition.

FIG. 11 depicts in another cross-sectional view an example MESA structure 1100 for use with the arrangements shown at a processing stage prior to the MESA etch processes described above. In FIG. 11, the layer 1120 includes a copper or other metal layer that forms the bottom plate of the capacitor structure and any intervening dielectric layers such as intra-metal dielectric (IMD) or interlevel dielectric layers (ILD) and can include oxides, nitrides, oxynitrides and high-K and low-K dielectrics. In this arrangement the MESA capacitor structure can be inserted into a prior semiconductor fabrication process that uses multiple level metals and inter-metal dielectrics. A silicon nitride barrier layer 1122 is shown formed on the layer of prior materials 1120 and can be, for example, of thickness of about 0.05-0.2 microns. Following the barrier layer 1122, an oxide layer labeled "sub-ESL MESA oxide" 1124 is formed, and this layer can be of thickness from 0.3-1.0 ums, for example. An etch stop layer 1126, which is shown as silicon oxynitride or SiON, is then formed over the sub-ESL MESA oxide layer. This layer is used to enable selective etch of the MESA oxide layer to be deposited. The etch stop layer is relatively thin and can be of thickness from about 0.1-0.5 ums, for example.

Finally the MESA oxide layer 1130 is formed over the etch stop layer 1126. As is described above, in one arrangement this layer can be formed in a single deposition step to provide a monolithic oxide dielectric layer. However, the thickness needed for high voltage or extra-high voltage applications is quite large, for example, from about 6 ums to about 12 ums. This very thick layer of oxide formed over the entire wafer can cause substantial wafer bow or warpage. While the subsequent oxide etch processes will remove most of this layer from areas where it is not needed and thus relieve the wafer bow or warp, the stress on the wafer is significant in this approach. However, to form the thick layer 1130 in a single deposition step requires a substantial deposition time in a processing chamber, for example in a TEOS processing chamber, and the thick oxide is also deposited on the walls of the processing chamber. A plasma etch and clean process is then performed to remove the thick oxide from the walls of the chamber prior to the next wafer being processed. In an alternative approach contemplated by the inventors as forming additional arrangements of the present application, multiple depositions of TEOS oxide, for example, can be performed in a sequence to reduce the tool cleaning time and multiple chamber tools can be used so that while a deposition is proceeding in one chamber, another is being cleaned and ready for another deposition. Throughput and reliability of the deposition oxide can be increased using these approaches. MESA dielectric layer 1130 can be formed using multiple deposition steps, and this approach reduces tool clean time and increases throughput.

Figure 12:
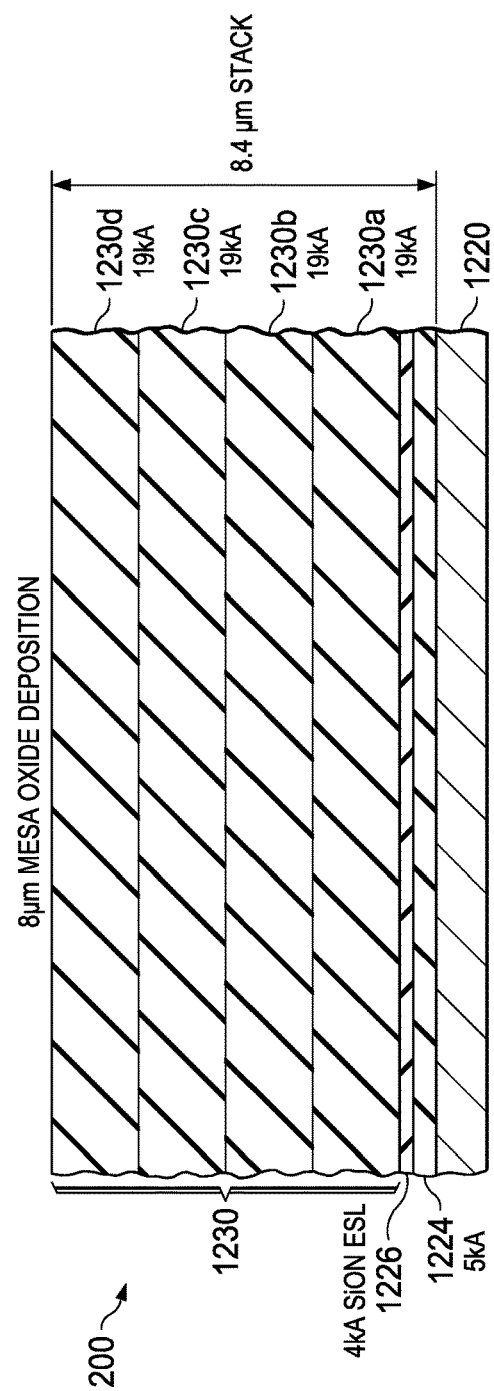
FIG. 12 depicts in another cross sectional view a portion of a high voltage capacitor dielectric using the MESA structure of the arrangements, illustrating a multiple step oxide deposition.

FIG. 12 depicts in another cross sectional view 1200 an alternative arrangement for forming the MESA oxide which reduces the stress experienced by the wafer. In FIG. 12, the numbers used are repeated from FIG. 11 for continuity; however the first two digits are incremented to "12". In FIG. 12, MESA oxide structure 1200 includes the underlying layers including a metal bottom plate 1220, a sub-ESL oxide layer 1224, a silicon oxynitride etch stop layer 1226, and the MESA dielectric deposition layer 1230. In this non-limiting, example arrangement, a MESA oxide deposition of about 8 ums is desired. Of course other thicknesses can be obtained and these variations are contemplated as forming additional novel arrangements. In this illustrative arrangement, the oxide layers that make up MESA deposition 1230 are formed using a TEOS source gas in a CVD or PECVD chamber. In this deposition, the process is varied to provide various thicknesses and stresses in the oxide layers. For example, the sub-ESL oxide layer 1224 is deposited to an example thickness of 5 k Angstroms (0.5 ums). An etch stop layer 1225 is then deposited over the initial oxide deposition to a thickness of about 3-4 kA. The etch stop layer (ESL) is used in a selective etch to pattern the MESA oxide structure and can be, for example, a silicon nitride, or silicon oxynitride, layer. In FIG. 12, the example shows a silicon oxynitride (SiON) etch stop layer 1226. The MESA oxide structure 1230 is shown formed using multiple depositions of approximately equal thickness. In an alternative approach that is also contemplated as an additional arrangement, however, different thicknesses layers could be used. These sub-layers are numbered 1230a, 1230b, 1230c, and 1230d. In this non-limiting example, a series of oxide depositions of 1.9 ums (19 kA) thickness is made. Further, in forming the oxide 1230 in multiple steps, in situ cooling can be performed between depositions which further reduces stress on the equipment and the wafers. The oxide uniformity in layer 1230 is improved by forming multiple layers 1230a-1230d of smaller thickness, versus a single layer deposition process. The amount of wafer bow or warp is greatly reduced or can be eliminated when the multiple deposition approach of FIG. 12 is used. Note that the thickness of layer 1230, and of each of the sublayers 1230a-1230d, is arbitrary and this illustration presents but one example arrangement of many that can be formed using the aspects of the present application. Variations in the thicknesses form additional arrangements that are contemplated by the inventors and which fall within the scope of the appended claims. The use of the etch stop layer 1226 improves the uniformity of the remaining sub-ESL oxide layer after MESA etch. The total thickness obtained for the MESA structure including the ESL layer and the sub-ESL oxide layer in this non-limiting example is 8.4 ums. This thickness is obtained from the sum of four equal layers of 1.9 ums (7.6 ums) plus an ESL layer 1226 of 0.3 ums and a sub-ESL layer 1224 of 0.5 ums. Other dielectric thicknesses can be obtained by adding additional deposition steps or reducing the number of deposition steps in forming layer 1230. In addition, the layers can be of varying thicknesses and of unequal or equal thicknesses.

Figure 13:
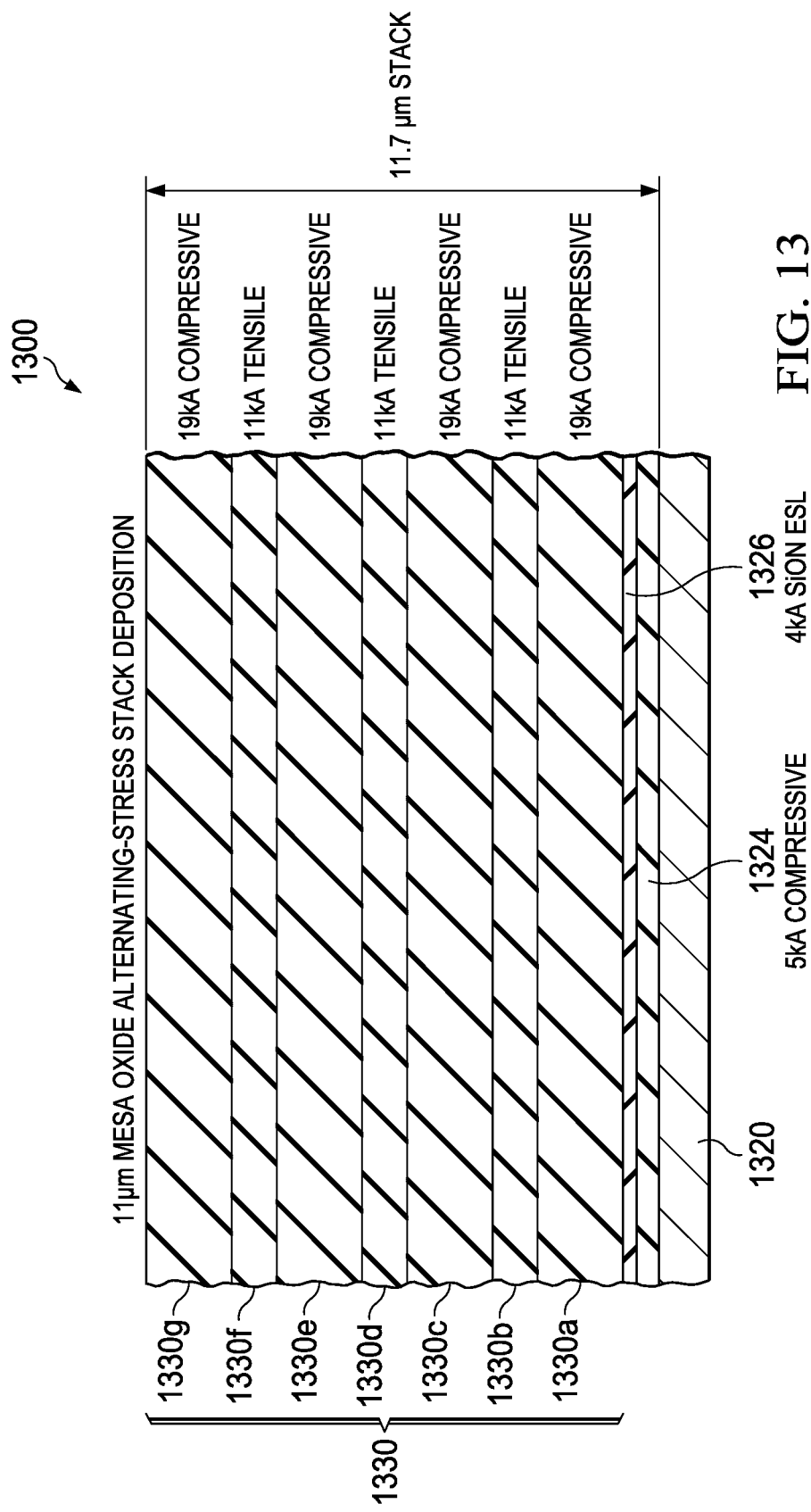
FIG. 13 depicts in a further cross sectional view a portion of a high voltage capacitor dielectric using an alternative MESA structure of the arrangements, illustrating a multiple step oxide deposition with tensile and compressive stress layers.

FIG. 13 depicts in another cross section 1300 an additional alternative arrangement for forming the MESA oxide structure with reduced stress on the wafer.

In FIG. 13 the structure is shown after the MESA dielectric deposition and prior to etch of the MESA structure. In FIG. 13, MESA oxide structure 1300 includes the underlying layers including a metal bottom plate 1320, a sub-ESL oxide layer 1324, a silicon oxynitride etch stop layer 1326, and the MESA dielectric deposition layer 1330. In FIG. 13, the MESA dielectric structure 1330 is formed of alternating oxide layers 1330a, 1330b, 1330c, 1330d, 1330e, 1330f, 1330g exhibiting tensile and compressive stress. As is known to those of skill in the art of oxide deposition using TEOS sources, the pressure, temperature, deposition time, and gas concentration can be varied to form either compressive, or tensile, oxide layers. Depositing layers using a higher pressure or higher RF power can create a compressive layer; while in contrast, using a lower RF power or lower pressure can create a tensile layer. In the non-limiting example of FIG. 13, the layers include layers of compressive stress (1330a, 1330c, 1330e, 1330g) that are 19 kA (1.9 ums) thick alternating with layers of tensile stress (1330b, 1330d, 1330f) that are 11 kA (1.1 ums) thick. Variations in processing parameters can be used to create additional or fewer layers, and layers of compressive, neutral, or tensile stress and these variations create MESA structures that form additional arrangements contemplated by the inventors of the present application and which also fall within the scope of the appended claims. By alternating the layers to form compressive stress and tensile stress oxide layers one upon another, the stress on the wafer, and the resulting wafer bow or warp, is reduced or eliminated completely. In this approach the wafer stress and wafer bow effects that would occur in a single deposition of the MESA oxide as described above is removed. The example MESA oxide 1330 of FIG. 13 includes a total thickness above the bottom metal plate 1320 of 11.4 ums, that thickness includes 4 layers of compressive stress oxide (1330a, 1330c, 1330e, 1330g) at 1.9 ums (7.6 ums total), 3 layers of tensile stress material (1330b, 1330d, 1330f) at 1.1 ums each, (3.3 ums total), and a layer 1324 of ESL material, in this example, 0.3 ums, and a layer of sub-ESL oxide, in this example, 0.5 ums. When added together the thickness of the resultant dielectric structure shown in 1300 is 11.7 ums. The dielectric thickness can be increased by using more layers or reduced by using fewer layers.

Figure 14:
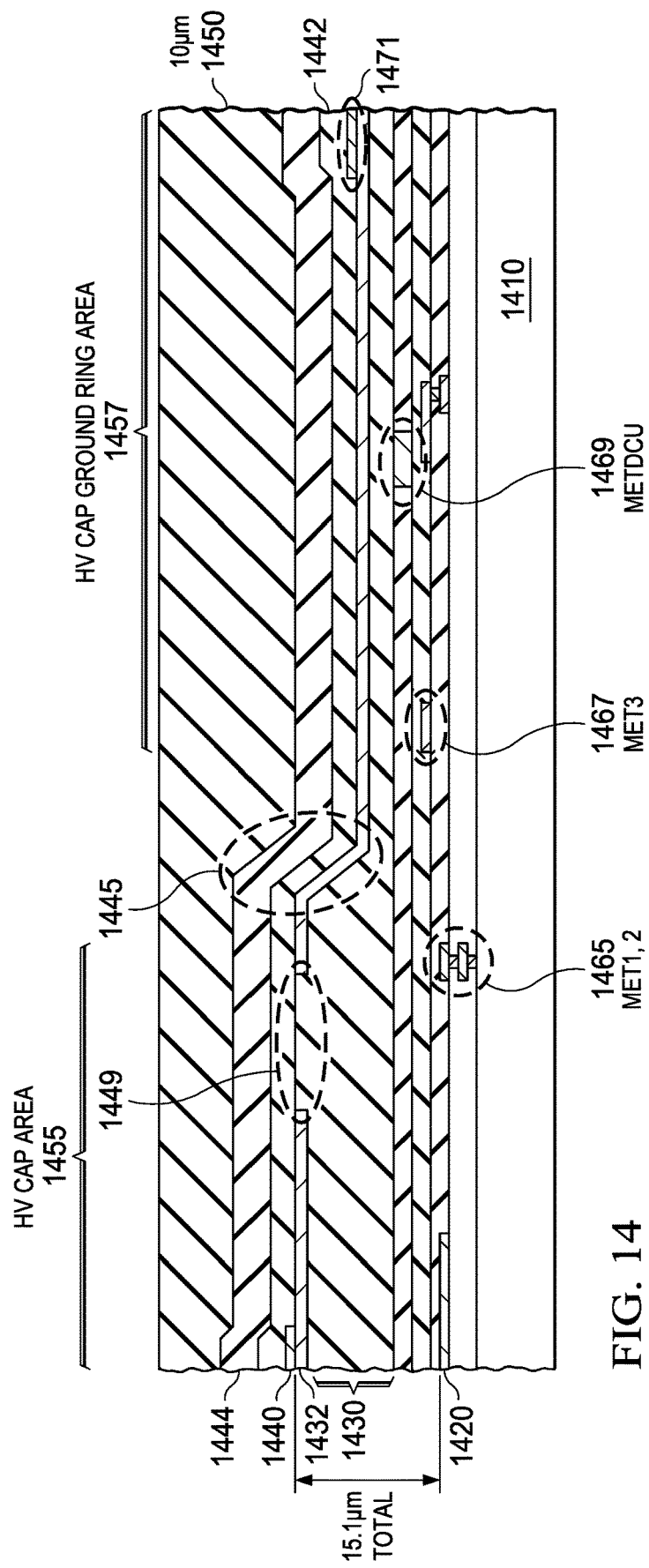
FIG. 14 depicts in yet another cross sectional view a completed high voltage or extra-high voltage capacitor incorporating a novel MESA structure of the arrangements.

FIG. 14 depicts in another cross sectional view 1400 an example high voltage or extra high voltage capacitor arrangement formed using the MESA structures and processes of the present application. For continuity, the base numbers of the layers have been preserved from the previous figures only incrementing the left digit to "14" including the substrate 1410, the bottom capacitor plate 1420, the primary MESA TEOS layer 1430, the two layer dielectric 1432, the top metal plate 1440, the 2nd PO layer 1444 and the top PI layer 1450.

In FIG. 14, a high voltage capacitor area 1455 labeled "HV Cap Area" is shown and a high voltage capacitor ground ring area 1457 labeled "HV Cap ground ring area" is shown in an adjacent portion of the structure. The slope region 1445 makes the transition from the HV Cap Area 1455 to the HV Cap ground ring area 1457.

In FIG. 14, a silicon or other semiconductor material forms substrate 1410. A bottom plate 1420 is formed over the initial metal and intra metal dielectric layers. For example bottom plate 1420 can be formed along with metal layer two. After metal layer three and intra-metal layers are formed, and after an etch stop layer is deposited, MESA capacitor dielectric layer 1430 is formed using any of the deposition methods described above, such as forming multiple depositions in a sequence in a single processing tool or in multiple chambers of one or more processing tools.

The silicon oxide-silicon oxynitride dielectric layer 1432 in FIG. 14 is formed over the MESA capacitor dielectric layer 1430 and has an opening 1449 spaced from the edge of top plate conductor 1440. The sloped region 1445 is shown transitioning from the high voltage capacitor area 1455 to the lower voltage capacitor area 1457 at an angle from the horizontal. PO layers 1444 and 1455 are shown overlying the structure.

In FIG. 14, several structures are shown that can be used to shield or provide additional ground rings for the high voltage capacitor. A Faraday cage 1465 is shown formed approximately 40 ums from the edge of the top plate 1440 in the high voltage capacitor region and this Faraday cage is coupled to the substrate 1410 and including a metal-1 portion and a metal-2 stacked portion that is electrically connected together. This optional Faraday cage can surround the capacitor as a ring and provide additional shielding. A third level metal (MET3) portion 1467 is used as a ground ring and is formed at about 70 ums horizontal spacing from the high voltage capacitor. A damascene copper metal portion 1469 labeled METDCU is formed between nitride barrier layers and extending through an intra-metal dielectric or IMD oxide and is positioned 100 ums horizontal spacing from the high voltage capacitor. A ground ring structure 1471 is formed from the top metal at the right side of the structure. Each of these shielding structures can be used independently or in combination with the high voltage or extra high voltage capacitor structure to increase the performance and reduce noise effects and unwanted coupling. The spacing distances shown are examples and can be modified using known simulation tools to suit a particular application or semiconductor process. The thickness of the dielectric, here shown as 15.1 ums, can also be modified as described above and any one of the approaches to forming the dielectric layer 1430 can be used, either a single deposition, multiple oxide depositions, or tensile and compressive stress oxide layers in alternating depositions, can be used with the ground rings and shields to increase performance.

Figure 15:
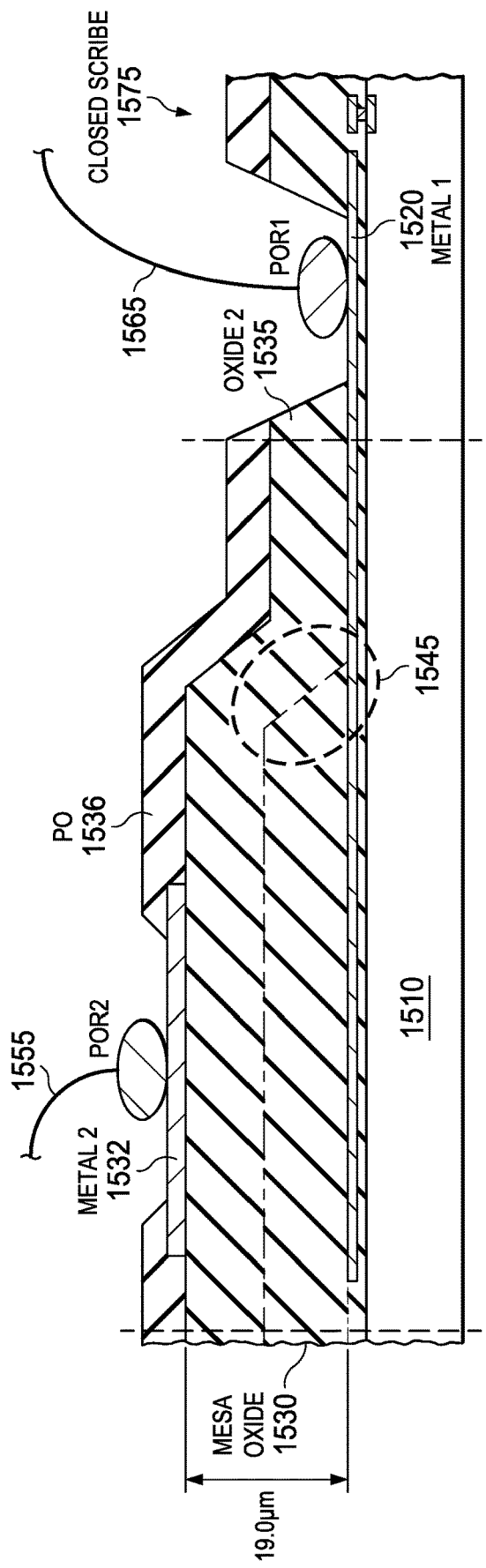
FIG. 15 depicts in another cross sectional view a completed high voltage or extra-high voltage capacitor incorporating a novel MESA structure of the arrangements.

FIG. 15 depicts in another cross sectional view 1500 an alternative arrangement for a MESA capacitor structure that forms an additional aspect of the present application. Numbers for elements that are similar to those shown in the figures above are again used but with the first two digits now replaced with "15". Substrate 1510 can be silicon, or another semiconductor material such as gallium arsenide, or an epitaxial layer of semiconductor material, and may have various components such as MOS transistors, diodes, FETs, bipolar transistors, resistors and capacitors formed within it. FIG. 15 illustrates an arrangement where the MESA structure and formation method are used with a two level metal system in a semiconductor process. The bottom plate of a high voltage or extra high voltage capacitor is formed using the metal one layer, which can be a metal conductor such as copper, aluminum, and alloys thereof, for example. A MESA oxide dielectric layer 1530 is then formed over the metal one layer. A diffusion barrier (not shown for simplicity in FIG. 15) can be deposited over the metal and lie between the metal and the MESA oxide layer. The MESA oxide layer 1530 can be formed as a single deposition oxide layer, or using the multiple oxide depositions or using the compressive/tensile stress oxide layers as described above. The MESA oxide layer 1530 is shown in FIG. 15 after etch to create the sloped transition area 1545. After the sloped transition in area 1545 is created by MESA etching regions where a graded photoresist technique was employed, a second level oxide layer 1535 is deposited. This oxide layer 1535, labeled OXIDE 2, is the same oxide layer that would be used between metal-1 and metal-2 in the two level metallization system. The oxide layer 1535 lies conformally over the MESA oxide 1530 and follows the sloped region in transition area 1545.

Following the deposition of the oxide 1535, which can also be a nitride, oxynitride, or other dielectric layer, the metal-2 layer is deposited over the wafer. In FIG. 15 the metal-2 layer portion 1532 is shown forming the top capacitor plate, and is illustrated after pattern and etch steps have been used to form the top plate.

A protective overcoat layer 1536 is then formed and an opening labeled POR2 is patterned and etched to expose the top surface of 1532. Connections can then be made for the top plate such as a wire bond and wire ball 1555 as illustrated in FIG. 15. In another portion of the substrate 1510, a second protective overcoat opening labeled POR1 exposes a portion of the metal-1 layer 1520 to allow a connection such as 1565 to be made to the bottom plate of the capacitor. A scribe line 1575 labeled "Closed Scribe" is form adjacent the connection 1565.

In an example semiconductor process, the thickness of the dielectric layer for the high voltage capacitor which is the sum of the thicknesses of the MESA oxide 1530 and the Oxide 2 layer 1535 that are positioned between the top of the bottom plate 1520 and the bottom of the top plate 1532 is 19 ums. This is but one non-limiting illustrative example and many other dielectric thicknesses can be obtained using the novel MESA structures and methods of the present application in a two level metallization system.

Figure 16:
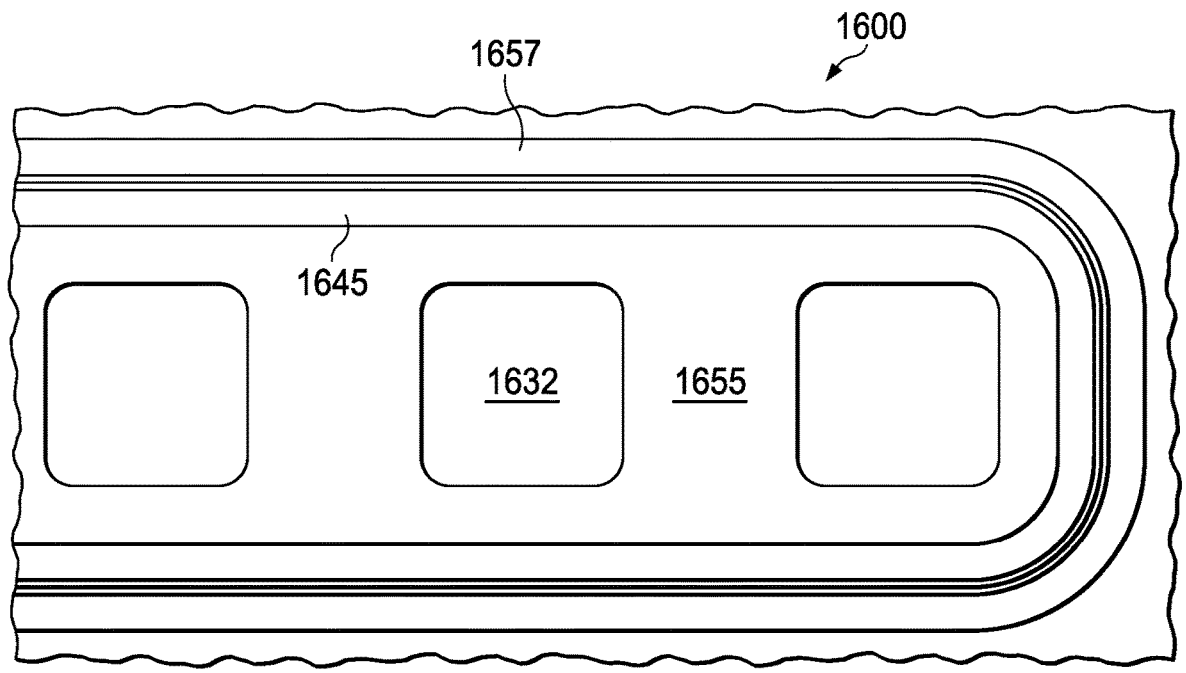
FIG. 16 depicts in a top view a portion of a high voltage or extra high voltage capacitor formed using the novel MESA structure of the arrangements.

FIG. 16 depicts in a top view 1600 a portion of a high voltage or extra high voltage capacitor arrangement formed using the novel MESA structure and methods of the present application. In FIG. 16 the top plate portions 1632 are shown with metal two exposed. The high voltage region 1655 is the top of the protective overcoat over the MESA structure. The transition sloped region 1645 lies outside the high voltage region, and the low voltage region 1657 lies outside the sloped region 1645 and provides the ground ring or low voltage areas as described above.

Figure 17:
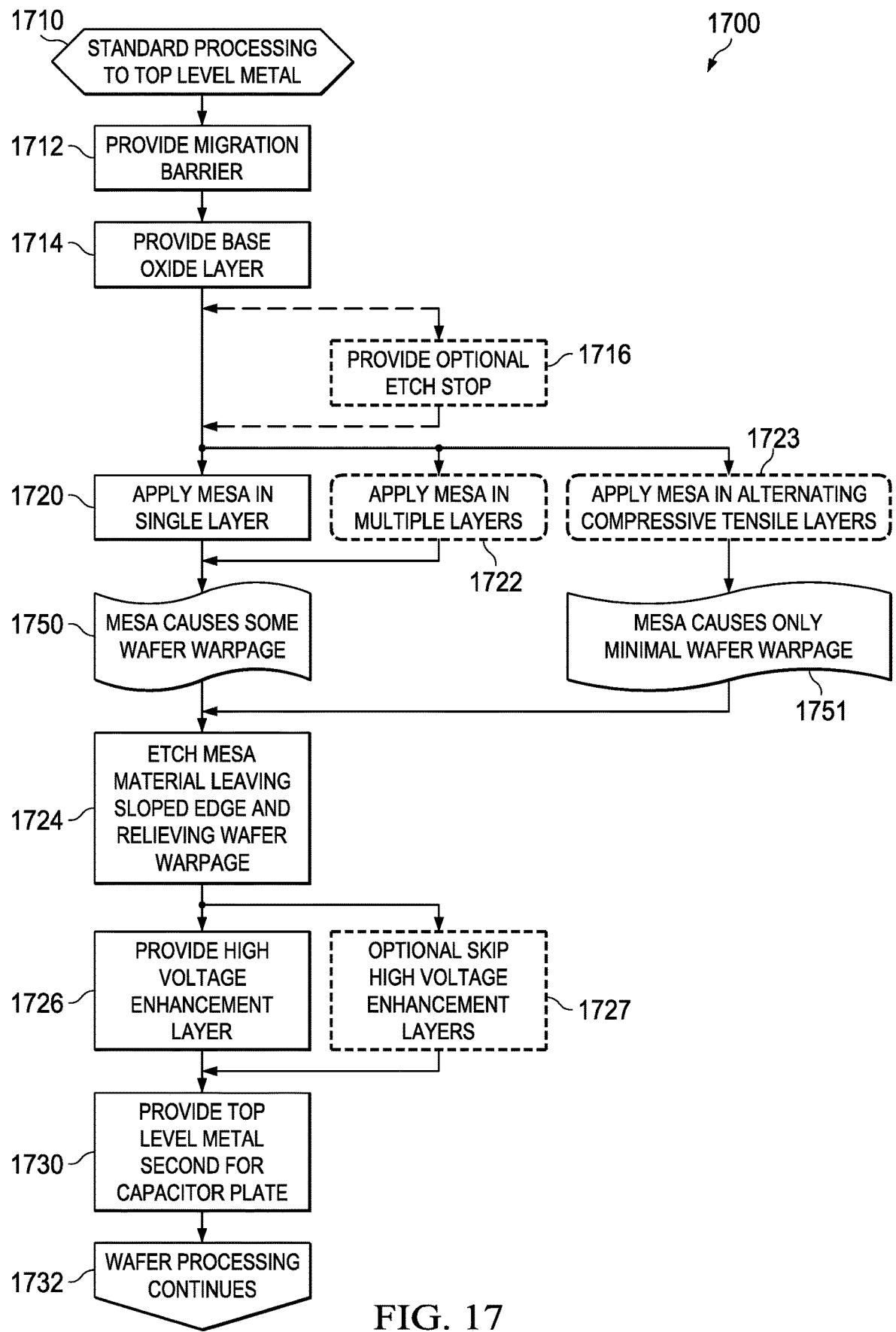
FIG. 17 is a flow chart of the method arrangement for creating a MESA capacitor structure.

FIG. 17 depicts in a flow diagram an example method arrangement 1700 for forming the MESA structures and high voltage or extra high voltage capacitors. In FIG. 17, fifteen steps are arranged with the primary flow having eight sequential steps (1710, 1712, 1714, 1720, 1724, 1726, 1730 and 1732) with an optional step 1716 after 1714 and alternate steps 1722, 1723 that parallel 1720. Consequence indicators 1750, 1751 and 1752 surround step 1724.

The starting point 1710 of method 1700 is a wafer processed normally in a semiconductor fabrication process. In processing the wafer, various integrated circuit devices including transistors, passive components, interconnections and the like are used to form circuitry on a plurality of integrated circuits. Power circuitry such as power supplies, converters, transformers and the like can be implemented on the integrated circuits on the wafer. In addition, various digital circuitry such as controllers and processors can be implemented and can be integrated with the other functions to provide highly integrated circuitry.

The highest metal layer formed in the semiconductor process prior to the start of method 1700 becomes the first or bottom capacitor plate in a parallel plate capacitor. The next steps of method 1700 provide a barrier to prevent metal migration in step 1712 and a base layer of silicon dioxide in step 1714. At this point, an optional etch stop layer 1716 may be provided to the wafer to assist in the later etching of the MESA layer. After the optional etch stop layer is formed in 1716, either a single layer (step 1720) or multiple layers of TEOS (silicon oxide) (step 1722) or alternating layers of compressive and tensile stress layers (step 1723) are provided to create the MESA dielectric. The consequence indicator 1750 shows that wafer warpage is likely to occur at this point if a thick MESA layer is formed in a single layer. The consequence indicator 1751 illustrates that the wafer warpage is minimal if the alternating stress and tensile layers of step 1723 are used to perform the MESA structure.

The next step, 1724, is to etch the MESA TEOS layer to relieve the stress. In that etch operation, a sloped edge is etched into the thick MESA layer which forms a boundary between the thickest region of the MESA dielectric, protected by photoresist during etch, and the low-level regions which had no photoresist protection during the etch. After etch, consequence indicator 1752 shows that wafer warpage (to the extent that any is present) is relieved. Following the etch is step 1724, there are two remaining steps, the first is to provide a high voltage enhancement layer in step 1726, or in an alternative method, to skip forming this high voltage enhancement layer in step 1727; and the second is to provide top level metal in step 1730 which becomes the second or top plate of the capacitor. In the final state 1732, the wafer processing continues to complete the wafer fabrication. Following the formation of the MESA structure, the remaining processing avoids CMP steps to prevent damaging the thick MESA structure.

Figure 18:
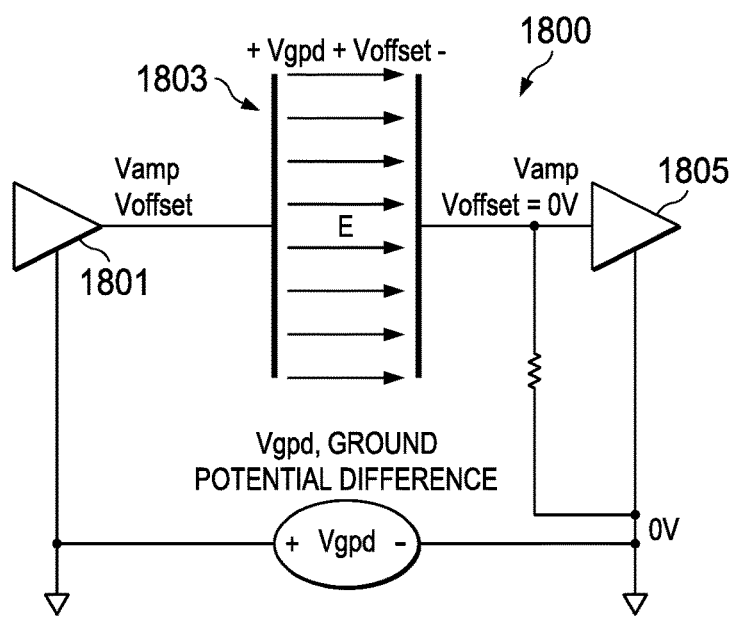
FIG. 18 depicts in a block diagram an example application for isolation using a capacitor of the arrangements in a circuit arrangement.

FIG. 18 depicts in a block diagram an example application for isolation using a capacitor of the arrangements in a circuit 1800. In FIG. 18, a transmitting amplifier 1801 is shown coupled to one plate of an isolation capacitor 1803. A receiver amplifier 1805 is shown coupled to the opposite plate of the isolation capacitor 1803. The two amplifiers 1801 and 1805 are remote from one another and on different ground potentials such that a ground potential difference, shown as voltage Vgpd, exists. By using an isolation capacitor, the two grounds are not tied together but remain isolated from one another. There is no DC path between the two amplifiers and signals from the transmitter 1801 can be received at the receiver 1805 reliably as a result.

Figure 19:
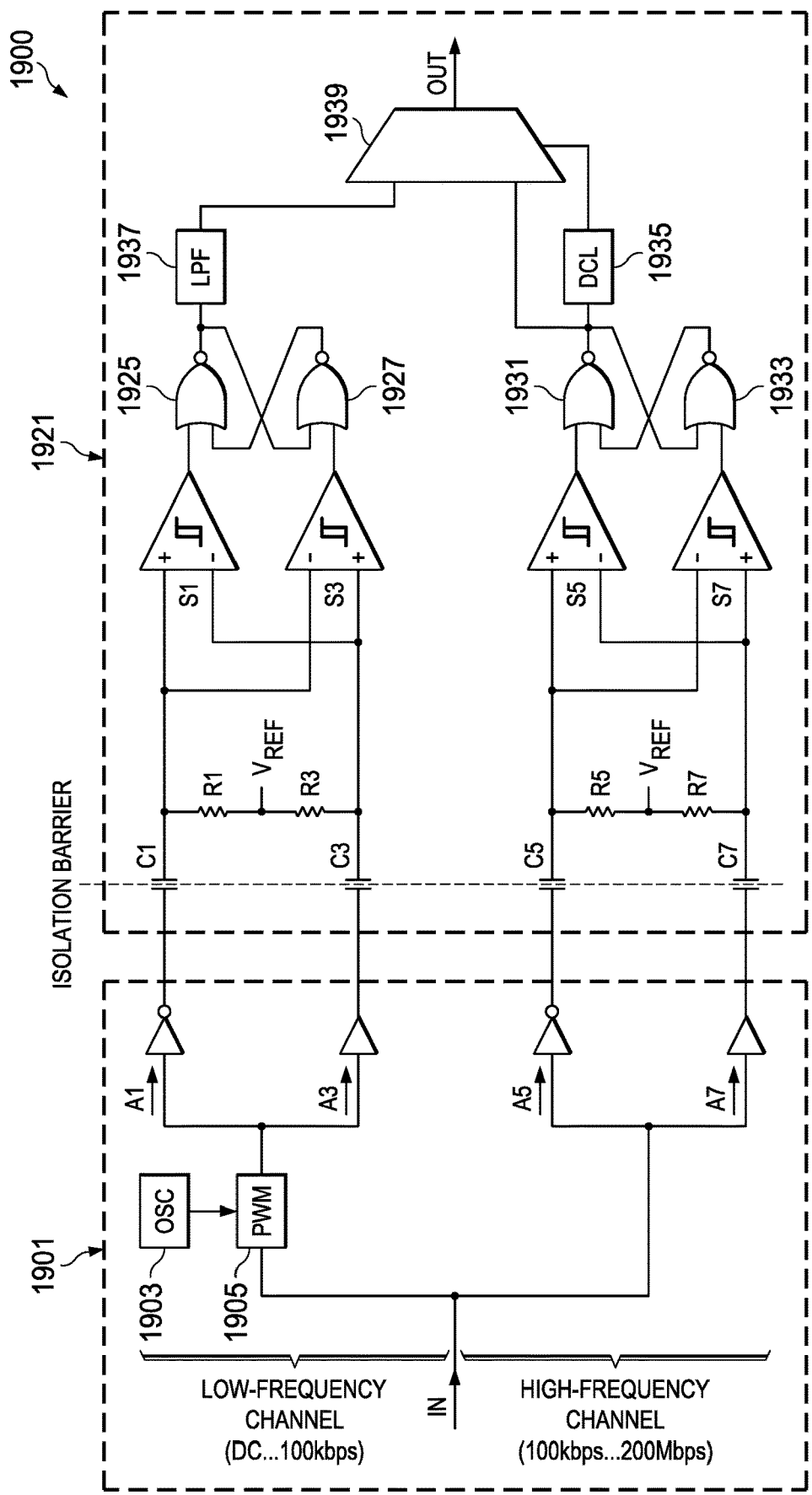
FIG. 19 depicts in a circuit diagram an application for isolation capacitors.

FIG. 19 depicts in a circuit diagram an application for isolation capacitors using the arrangements of the present application. In FIG. 19, a transmitter circuit 1901 that is in a first power domain is shown transmitting signals to a receiver circuit 1921. In FIG. 19, the transmitter has both low-frequency and high frequency channels. The low frequency channel is sampled using an oscillator 1903 to provide a clock to a pulse width modulation function 1905. The data samples are output to an inverting amplifier A1 and a non-inverting amplifier A3 to provide a differential signal as an output. In a parallel path, high frequency signals are input to an inverting amplifier A5 and a non-inverting amplifier A7 to provide a second differential output signal. The receiver circuit 1921 has a separate power and ground domain so that there would be a differential voltage between ground potentials, for example. At the inputs of receiver circuit 1921, capacitors C1, C3, C5 and C7 are coupled to isolate the input signals from the remainder of the circuit 1921 and to provide an isolation barrier. Offset voltages are compensated using a reference voltage Vref and resistors R1, R3, and R5, R7. The input signals from the capacitors C1, C3, C5, C7 are then input to pairs of Schmitt trigger amplifiers with hysteresis to provide glitch prevention noise reduction, and then latched by logic gate 1925, 1927 (low frequency signals) and gates 1931, 1933 (high frequency signals). The outputs of the low frequency path are low pass filtered at LPF 1937, and input to an output multiplexer 1939. The outputs of the high frequency path are input to a decision block DCL 1935 and to the other input of the output multiplexer 1939. The receiver circuit can output either high frequency or low frequency signals at the OUT terminal. The high voltage or extra-high voltage capacitors of the arrangements are used to provide the isolation capacitors C1, C3, C5 and C7 so that the two circuits are galvanically isolated. The receiver 1921 and the transmitter 1901 can be separate circuits, separate circuit boards, separate integrated circuits or remote portions of a circuit board or integrated circuit. The capacitors C1, C3, C5, and C7 can be integrated with the remaining components in receiver 1921 for example, or provided as discrete components or as a module or analog integrated circuit.

Figure 20:
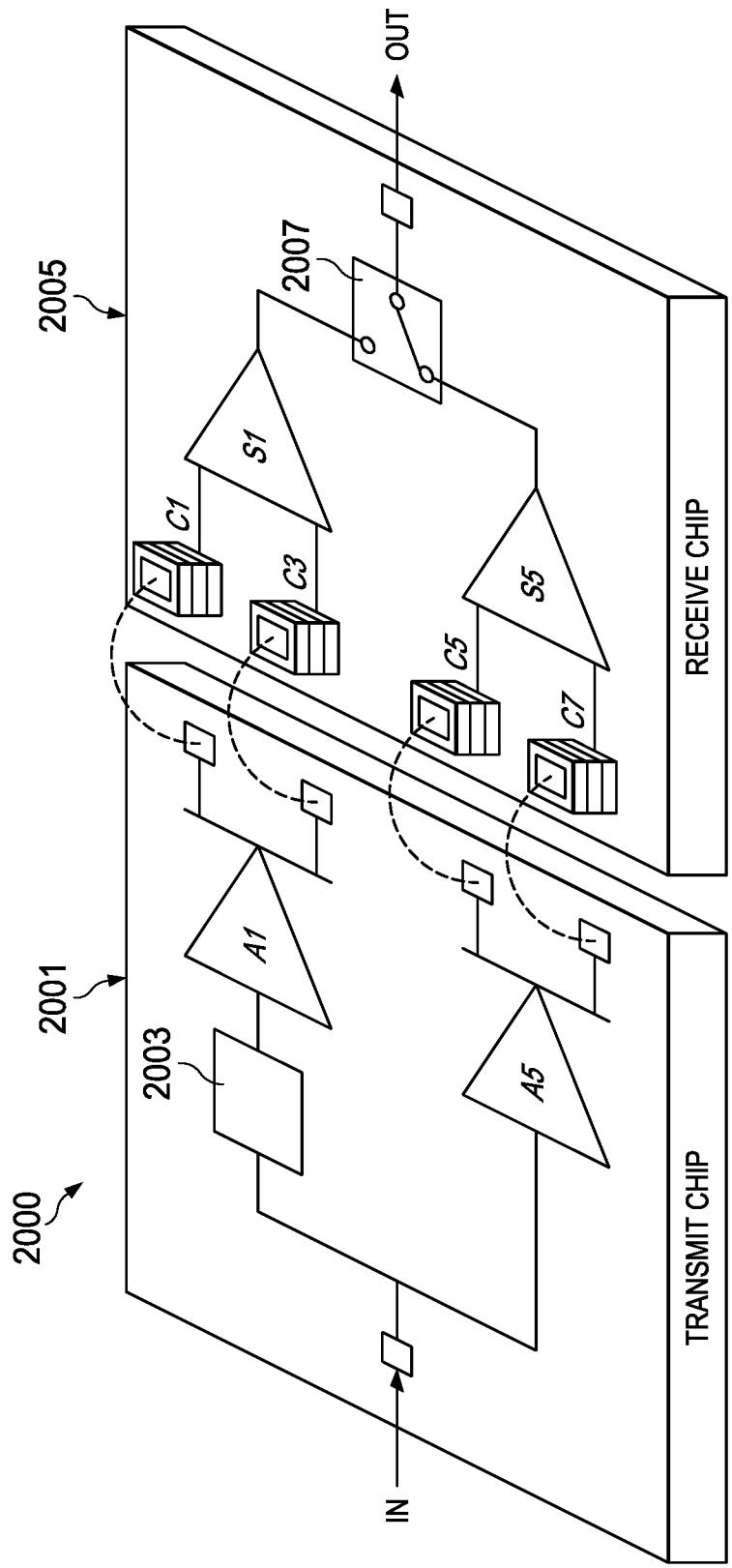
FIG. 20 depicts in a block diagram an example arrangement incorporating the isolation capacitors of the present application.

FIG. 20 depicts in a block diagram an example arrangement 2000 that incorporates the isolation capacitors of the present application. In FIG. 20, a transmitter circuit 2001 is coupled to a receiver circuit 2005. As shown in FIG. 20, the two circuits can be individual integrated circuit dies. In a non-limiting example arrangement, the two integrated circuits can be coupled by bond wires, balls such as BGA balls, bumps, solder columns, or the like. In one non-limiting example the two integrated circuits 2001, 2005 can be IC dies disposed in a single package. In additional alternative arrangements, the two integrated circuits 2001, 2005 can be provided in separate packages.

In the example arrangement depicted in FIG. 20, the transmitter 2001 is shown with wire bond connections coupling the amplifiers A1, A5, which are differential signal amplifiers in this non-limiting example, to the top plates of the capacitors C1, C3, C5, and C7 that are disposed on the receiver 2005. The example in FIG. 20 shows wire connections, e.g. bond wires, between the two devices, however other connections such as solder balls, solder columns, solder bumps, micro-BGA or BGA balls and the like, can be used to connect the two devices.

Because the transmit IC 2001 is coupled to the top plate of the capacitors on the receiver device 2005, and the capacitors are the high voltage or extra high voltage capacitors of the arrangements as described above, the two circuits are galvanically isolated one from another. The receiver amplifiers S1, S5 are coupled to the low voltage portions of the capacitors C1, C3, C5, C7, that is, by coupling to the bottom plates. The receiver circuit shows differential inputs to a first amplifier S1 and a second amplifier S2, one for the low frequency channel, for example, and one for the high frequency channel, and a selector 2007 selects the channel for transmitting as an output.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A capacitor structure, comprising:
a semiconductor substrate;
a bottom plate comprising a conductive layer over the semiconductor substrate;
a capacitor dielectric layer deposited over at least a portion of the bottom plate and having a first thickness in a first region;
a sloped transition region in the capacitor dielectric at an edge of the first region, the sloped transition region extending from the first region to a second region of the capacitor dielectric layer having a second thickness lower than the first thickness; and
a top plate conductor formed over a portion but not all of the capacitor dielectric layer in the first region.

2. The capacitor structure of claim 1, wherein the capacitor dielectric layer is an oxide, and comprising at least one layer of dielectric material formed between the capacitor dielectric layer and the bottom plate that further comprises at least one of silicon nitride and silicon oxynitride.

3. The capacitor structure of claim 2, wherein the capacitor dielectric layer is a monolithic layer.

4. The capacitor structure of claim 3, wherein the capacitor dielectric layer comprises an oxide.

5. The capacitor structure of claim 2, wherein the capacitor dielectric layer comprises multiple dielectric layers.

6. The capacitor structure of claim 2, wherein the capacitor dielectric layer comprises multiple dielectric layers formed as alternating compressive stress and tensile stress layers.

7. The capacitor structure of claim 2, wherein a sum of the thicknesses of the capacitor dielectric layer and the at least one layer of dielectric is greater than about 8 ums.

8. The capacitor structure of claim 1, wherein the first thickness is between 6 ums and 15 ums.

9. A capacitor structure, comprising:
a semiconductor substrate;
a bottom plate comprising a conductive layer over the semiconductor substrate;
a capacitor dielectric layer deposited over at least a portion of the bottom plate and having a first thickness in a first region;
a sloped transition region in the capacitor dielectric at an edge of the first region, the sloped transition region extending from the first region to a second region of the capacitor dielectric layer having a second thickness lower than the first thickness; and
a top plate conductor formed over at least a portion of the capacitor dielectric layer in the first region, wherein the capacitor dielectric layer further comprises an upper layer comprising silicon dioxide and silicon oxynitride formed between the capacitor dielectric layer and the top plate conductor.

10. The capacitor structure of claim 9, wherein the upper layer of the capacitor dielectric layer further comprises openings made in the upper layer.

11. The capacitor structure of claim 9, wherein the capacitor dielectric layer is an oxide, and comprising at least one layer of dielectric material formed between the capacitor dielectric layer and the bottom plate that further comprises at least one of silicon nitride and silicon oxynitride.

12. The capacitor structure of claim 9, wherein the capacitor dielectric layer comprises an oxide.

13. The capacitor structure of claim 9, wherein the capacitor dielectric layer comprises multiple dielectric layers.

14. The capacitor structure of claim 9, wherein the capacitor dielectric layer comprises multiple dielectric layers formed as alternating compressive stress and tensile stress layers.

15. A high voltage capacitor structure, comprising:
a semiconductor substrate;
a bottom plate comprising a metal layer over the semiconductor substrate;
a capacitor dielectric layer deposited over at least a portion of the bottom plate and having a first thickness between 6 um and 20 um in a first region;
a sloped transition region in the capacitor dielectric at an edge of the first region, the sloped transition region extending from the first region to a second region of the capacitor dielectric layer having a second thickness lower than the first thickness; and
a top plate comprising metal formed over only a portion of the capacitor dielectric layer in the first region.

16. The high voltage capacitor structure of claim 15, wherein the capacitor dielectric layer is an oxide, and comprising at least one layer of dielectric material formed between the capacitor dielectric layer and the bottom plate that further comprises at least one of silicon nitride and silicon oxynitride.

17. The high voltage capacitor structure of claim 15, wherein the capacitor dielectric layer is a monolithic layer.

18. The high voltage capacitor structure of claim 15, wherein the capacitor dielectric layer comprises an oxide.

19. The high voltage capacitor structure of claim 15, wherein the capacitor dielectric layer comprises multiple dielectric layers.

20. The high voltage capacitor structure of claim 15, wherein the capacitor dielectric layer comprises multiple dielectric layers formed as alternating compressive stress and tensile stress layers.

* * * * *